US012757398B2

(12) United States Patent
Yook et al.

(10) Patent No.: US 12,757,398 B2
(45) Date of Patent: Oct. 6, 2026

(54) THREE-DIMENSIONAL SEMICONDUCTOR MEMORY DEVICE WITH BRIDGE PATTERN SUPPRESSION AND ELECTRONIC SYSTEM INCLUDING THE SAME

(71) Applicant: SAMSUNG ELECTRONICS CO., LTD., Suwon-si (KR)

(72) Inventors: Yeongeun Yook, Seongnam-si (KR); Hyuk Kim, Seongnam-si (KR); Youngsik Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 645 days.

(21) Appl. No.: 18/080,325

(22) Filed: Dec. 13, 2022

(65) Prior Publication Data

US 2023/0209826 A1 Jun. 29, 2023

(30) Foreign Application Priority Data

Dec. 27, 2021 (KR) ........................ 10-2021-0188760

(51) Int. Cl.
*H10B 43/27* (2023.01)
*H10B 43/40* (2023.01)
*H10W 20/20* (2026.01)

(52) U.S. Cl.
CPC ............. *H10B 43/27* (2023.02); *H10B 43/40* (2023.02); *H10W 20/20* (2026.01)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20;
(Continued)

(56) References Cited

U.S. PATENT DOCUMENTS 9,899,406 B2 2/2018 Kim et al.
9,911,692 B2 3/2018 Smith et al.
(Continued)

FOREIGN PATENT DOCUMENTS

KR 10-2010-0088128 A 8/2010
KR 1020190122372 A 10/2019

*Primary Examiner* — William B Partridge
*Assistant Examiner* — Gustavo G Ramallo
(74) *Attorney, Agent, or Firm* — Muir Patent Law, PLLC

(57) ABSTRACT

A three-dimensional semiconductor memory device includes a substrate including a first region and a second region, the second region extending from the first region; a stack including interlayer insulating layers and gate electrodes, which are alternately and repeatedly stacked on the substrate, the stack having a staircase structure on the second region; an insulating layer covering the staircase structure of the stack; first vertical channel structures on the first region, penetrating the stack, and in contact with the substrate; first contact plugs on the second region and penetrating the insulating layer and the stack; and first insulating pads in the insulating layer and enclosing upper portions of the first contact plugs, respectively, wherein the first insulating pads overlap with the first vertical channel structures in a horizontal direction.

20 Claims, 18 Drawing Sheets

(58) Field of Classification Search
CPC ........ H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 10,748,923 | B2 | 8/2020 | Son et al. | |
| 2009/0212350 | A1* | 8/2009 | Kidoh .................... | H10B 43/27<br>257/E21.21 |
| 2013/0087843 | A1 | 4/2013 | Han | |
| 2016/0268264 | A1* | 9/2016 | Hwang .................. | H10B 43/20 |
| 2017/0301688 | A1 | 10/2017 | Lee et al. | |
| 2018/0130819 | A1 | 5/2018 | Zhu et al. | |
| 2019/0035733 | A1* | 1/2019 | Park ...................... | H01L 23/535 |
| 2020/0105783 | A1 | 4/2020 | Baek | |
| 2020/0388624 | A1* | 12/2020 | Baek ...................... | H10B 43/27 |
| 2021/0043568 | A1 | 2/2021 | Hyun et al. | |
| 2021/0134832 | A1 | 5/2021 | Choi | |
| 2021/0143176 | A1 | 5/2021 | Yun et al. | |

* cited by examiner

THREE-DIMENSIONAL SEMICONDUCTOR MEMORY DEVICE WITH BRIDGE PATTERN SUPPRESSION AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0188760, filed on Dec. 27, 2021, in the Korean Intellectual Property Office, the entire contents of which are hereby incorporated by reference.

BACKGROUND

1. Field

Embodiments relate to a three-dimensional semiconductor memory device and an electronic system including the same.

2. Description of the Related Art

A semiconductor device capable of storing a large amount of data may be used as a data storage of an electronic system. Higher integration of semiconductor devices may help satisfy consumer demands for large data storing capacity, superior performance, and inexpensive prices. In the case of two-dimensional or planar semiconductor devices, since their integration is mainly determined by the area occupied by a unit memory cell, integration may be influenced by the level of a fine pattern forming technology. Extremely expensive process equipment may be needed to increase pattern fineness, which may set a practical limitation on increasing integration for two-dimensional or planar semiconductor devices.

SUMMARY

The embodiments may be realized by providing a three-dimensional semiconductor memory device including a substrate including a first region and a second region, the second region extending from the first region; a stack including interlayer insulating layers and gate electrodes, which are alternately and repeatedly stacked on the substrate, the stack having a staircase structure on the second region; an insulating layer covering the staircase structure of the stack; first vertical channel structures on the first region, penetrating the stack, and in contact with the substrate; first contact plugs on the second region and penetrating the insulating layer and the stack; and first insulating pads in the insulating layer and enclosing upper portions of the first contact plugs, respectively, wherein the first insulating pads overlap with the first vertical channel structures in a horizontal direction.

The embodiments may be realized by providing a three-dimensional semiconductor memory device including a first substrate including a first region, a second region extending from the first region, and a third region extending from the second region; a peripheral circuit structure including peripheral circuit transistors on the first substrate; a first insulating layer covering the peripheral circuit transistors; a second substrate on the peripheral circuit structure; lower insulating patterns in the second substrate; a stack including interlayer insulating layers and gate electrodes, which are alternately and repeatedly stacked on the second substrate and the lower insulating patterns, and having a staircase structure on the second region; a second insulating layer covering the staircase structure of the stack; a third insulating layer on the second insulating layer and coplanar with a topmost surface of the stack; vertical channel structures on the first region, penetrating the stack, and in contact with the second substrate; first contact plugs on the second region, the first contact plugs each penetrating the second and third insulating layers, the stack, and one of the lower insulating patterns, and being electrically connected to the peripheral circuit structure; a second contact plug on the third region, penetrating the second insulating layer and the third insulating layer and another of the lower insulating patterns, and being electrically connected to the peripheral circuit structure; insulating pads in the third insulating layer and enclosing upper portions of the first contact plugs and the second contact plug, respectively; bit lines on the third insulating layer and electrically connected to the vertical channel structures, respectively; and conductive lines on the third insulating layer and electrically connected to the first contact plugs and the second contact plug, respectively.

The embodiments may be realized by providing an electronic system including a three-dimensional semiconductor memory device; and a controller electrically connected to the three-dimensional semiconductor memory device and configured to control the three-dimensional semiconductor memory device, wherein the three-dimensional semiconductor memory device includes a substrate including a first region, a second region extending from the first region, and a third region extending from the second region; a stack including interlayer insulating layers and gate electrodes, which are alternately and repeatedly stacked on the substrate, and having a staircase structure on the second region; an insulating layer covering the staircase structure of the stack; vertical channel structures on the first region, penetrating the stack, and in contact with the substrate; first contact plugs on the second region and penetrating the insulating layer and the stack; a second contact plug on the third region and penetrating the insulating layer and the substrate; insulating pads in the insulating layer and enclosing upper portion of each of the first and second contact plugs; and an input/output pad connected to the second contact plug, the controller is electrically connected to the three-dimensional semiconductor memory device through the input/output pad, and a height of each of the first contact plugs and the second contact plug in a vertical direction is larger than a height of each of the vertical channel structures in the vertical direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
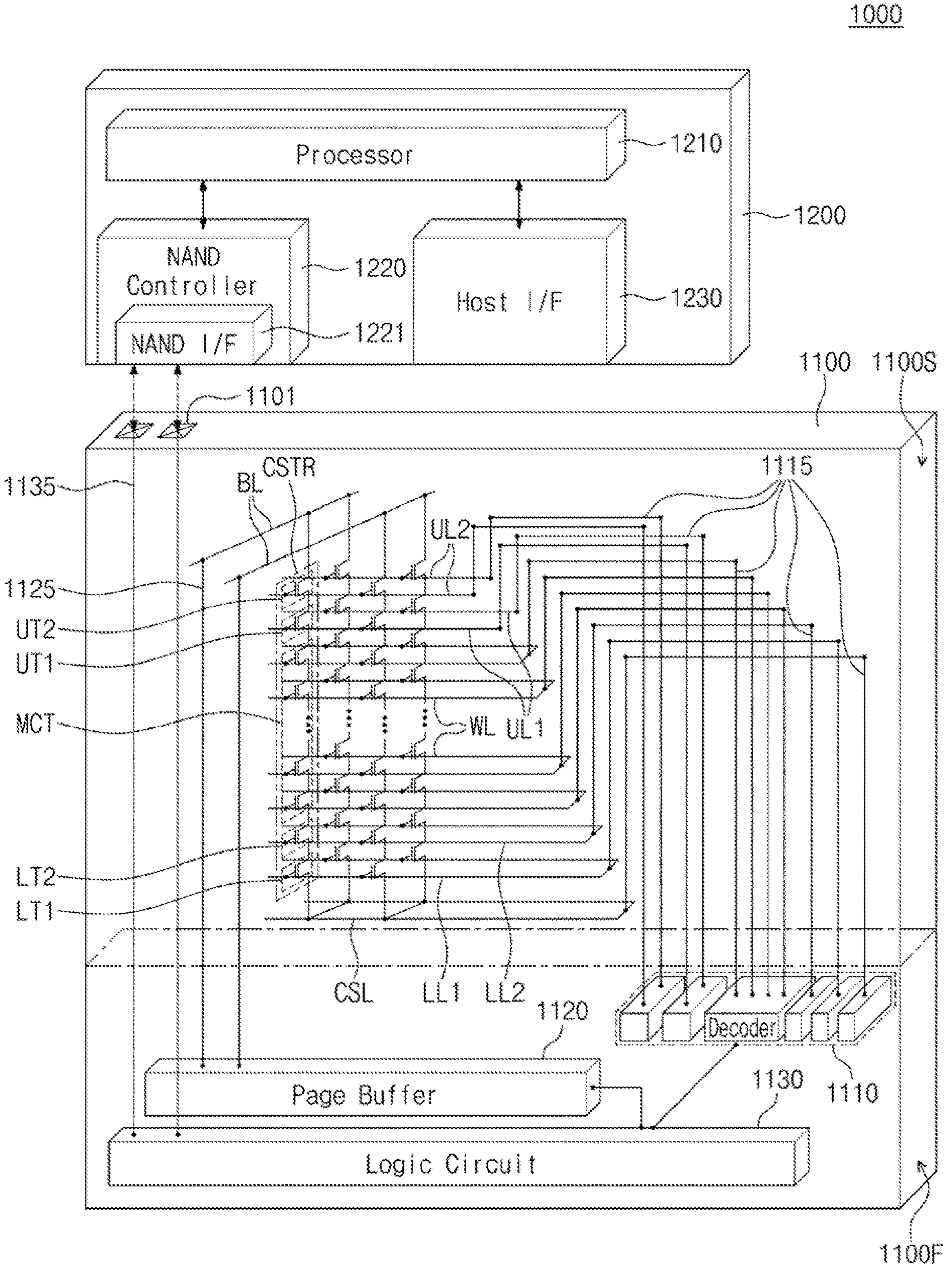
FIG. 1 is a schematic diagram of an electronic system including a three-dimensional semiconductor memory device according to an embodiment.

FIG. 1 is a schematic diagram of an electronic system including a three-dimensional semiconductor memory device according to an embodiment.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including such a storage device. In an implementation, the electronic system 1000 may be a solid state drive (SSD) device, a universal serial bus (USB), a computing system, a medical system, or a communication system, in which at least one three-dimensional semiconductor memory device 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. In an implementation, the first region 1100F may be beside the second region 1100S. The first region 1100F may be a peripheral circuit region, which includes a decoder circuit 1110, a page buffer 1120, and a logic circuit 1130. The second region 1100S may be a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT between the first transistors LT1 and LT2 and the second transistors UT1 and UT2. The number of the first transistors LT1 and LT2 and the number of the second transistors UT1 and UT2 may be variously changed, according to embodiments.

In an implementation, the first transistors LT1 and LT2 may include a ground selection transistor, and the second transistors UT1 and UT2 may include a string selection transistor. The first lines LL1 and LL2 may be used as gate electrodes of the first transistors LT1 and LT2, respectively. The word lines WL may be used as gate electrodes of the memory cell transistors MCT. The second lines UL1 and UL2 may be used as gate electrodes of the second transistors UT1 and UT2, respectively.

In an implementation, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit line BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one memory cell transistor selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which extends from the first region 1100F to the second region 1100S.

The controller 1200 may include a processor 1210, a NAND controller 1220, and a host interface 1230. In an implementation, the electronic system 1000 may include a plurality of three-dimensional semiconductor memory devices 1100, and in this case, the controller 1200 may control the plurality of three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing to the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands, which are used to control the three-dimensional semiconductor memory device 1100, data, which will be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the three-dimensional semiconductor memory device 1100.

Figure 2:
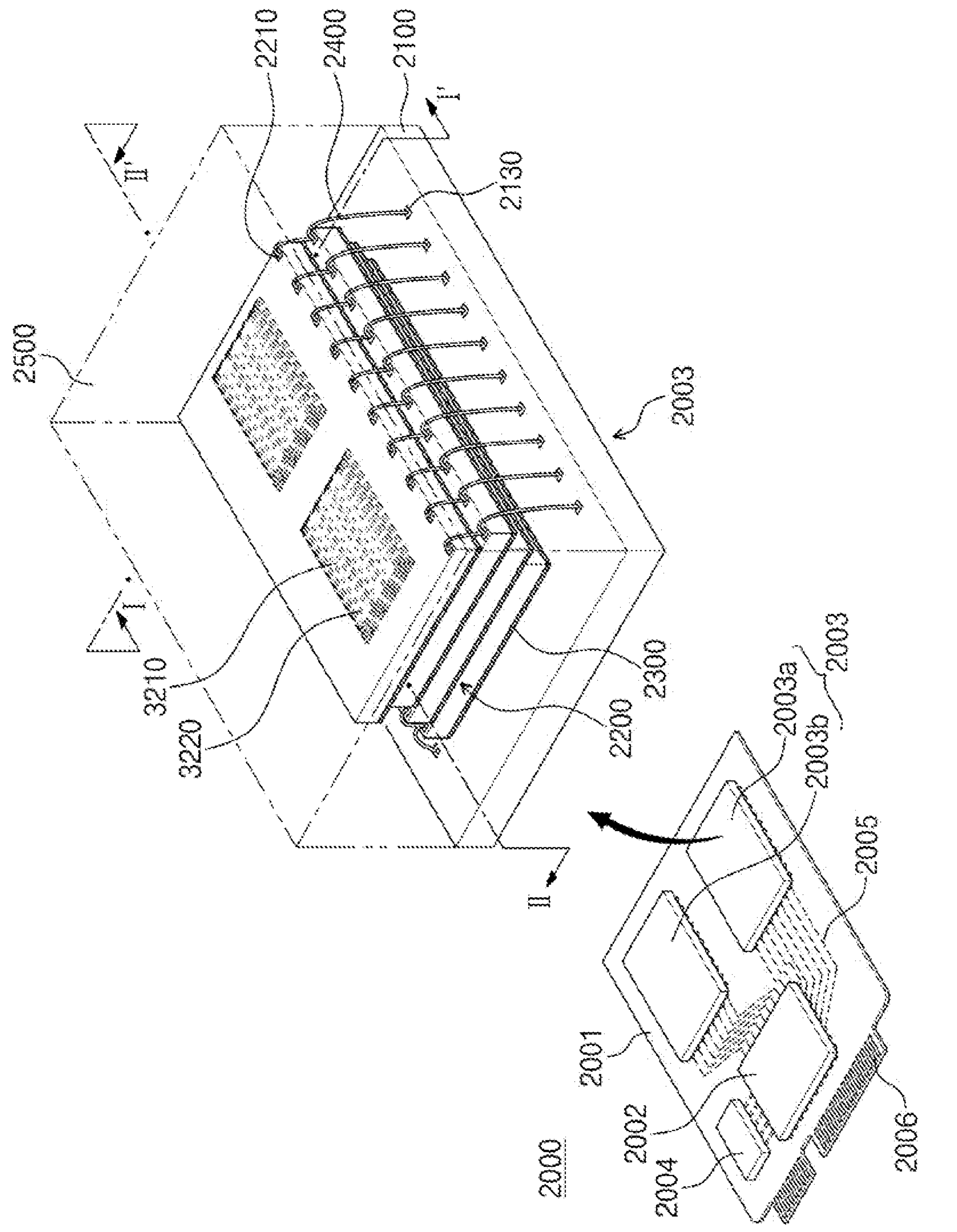
FIG. 2 is a perspective view schematically illustrating an electronic system including a three-dimensional semiconductor memory device according to an embodiment.

FIG. 2 is a perspective view schematically illustrating an electronic system including a three-dimensional semiconductor memory device according to an embodiment.

Referring to FIG. 2, an electronic system 2000 may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are in the main substrate 2001.

The main substrate 2001 may include a connector 2006, which includes a plurality of pins coupled to an external host. In the connector 2006, the number and the arrangement of the pins may be changed depending on a communication interface between the electronic system 2000 and the external host. In an implementation, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an implementation, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In an implementation, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b*, which are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 respectively on bottom surfaces of the semiconductor chips 2200, a connection structure 2400 electrically connecting the semiconductor chips 2200 to the package substrate 2100, and a molding layer 2500 on the package substrate 2100 to cover the semiconductor chips 2200 and the connection structure 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stacks 3210 and vertical channel structures 3220. Each of the semiconductor chips 2200 may include a three-dimensional semiconductor memory device, which will be described below.

In an implementation, the connection structure 2400 may be a bonding wire electrically connecting the input/output pads 2210 to the package upper pads 2130. In each of the first and second semiconductor packages 2003*a* and 2003*b*, the semiconductor chips 2200 may be electrically connected to each other in a bonding wire manner and may be electrically connected to the package upper pads 2130 of the package substrate 2100. In an implementation, the semiconductor chips 2200 in each of the first and second semiconductor packages 2003*a* and 2003*b* may be electrically connected to each other by through silicon vias (TSVs), not by the connection structure 2400 provided in the form of bonding wires.

In an implementation, the controller 2002 and the semiconductor chips 2200 may be included in a single package. In an implementation, the controller 2002 and the semiconductor chips 2200 may be mounted on an interposer substrate, which is prepared independent of the main substrate 2001, and may be connected to each other through interconnection lines, which are provided in the interposer substrate.

Figure 3:
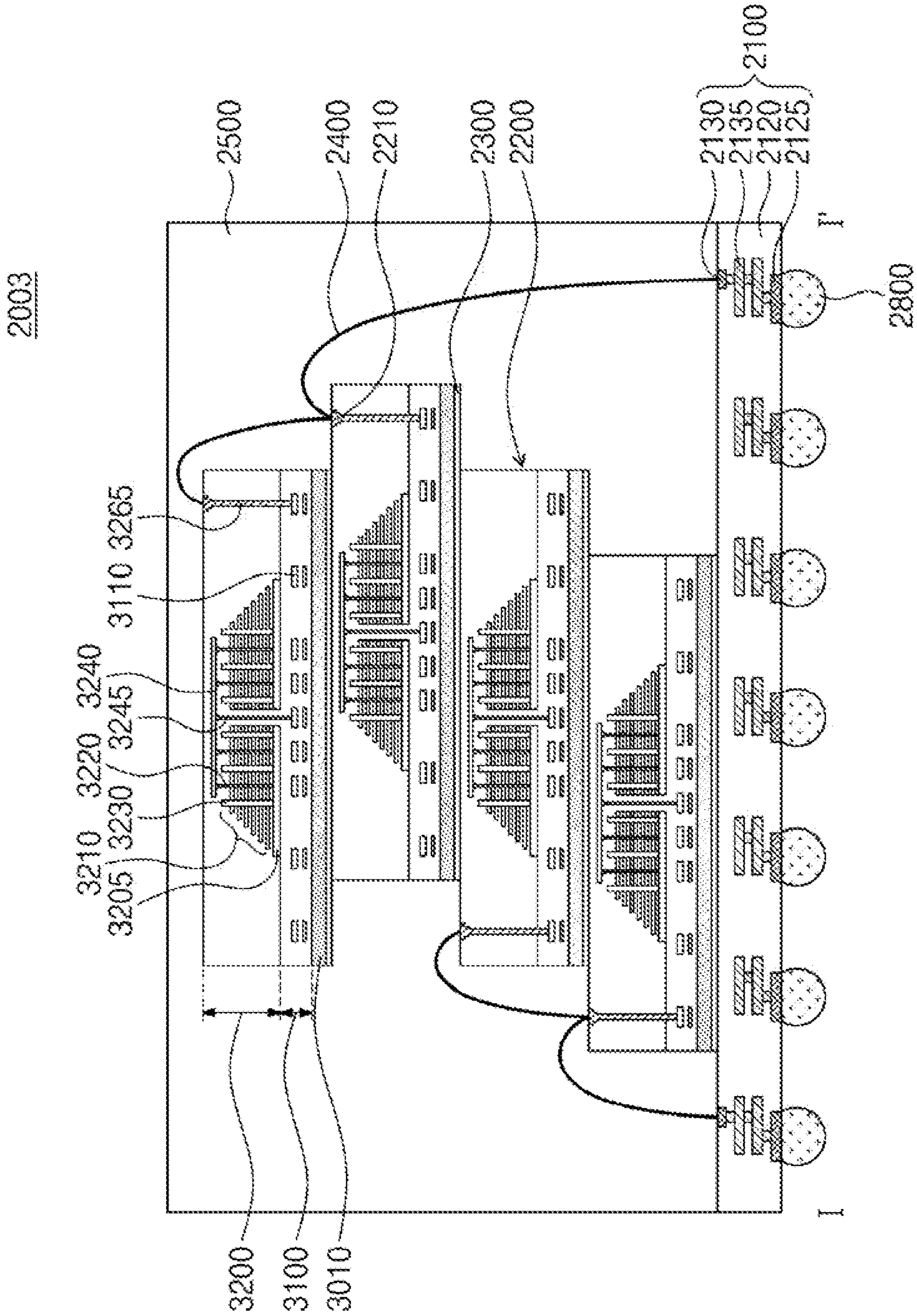
FIGS. 3 and 4 are sectional views, which are respectively taken along lines I-I' and II-II' of FIG. 2 of a semiconductor package including a three-dimensional semiconductor memory device according to an embodiment.
Figure 4:
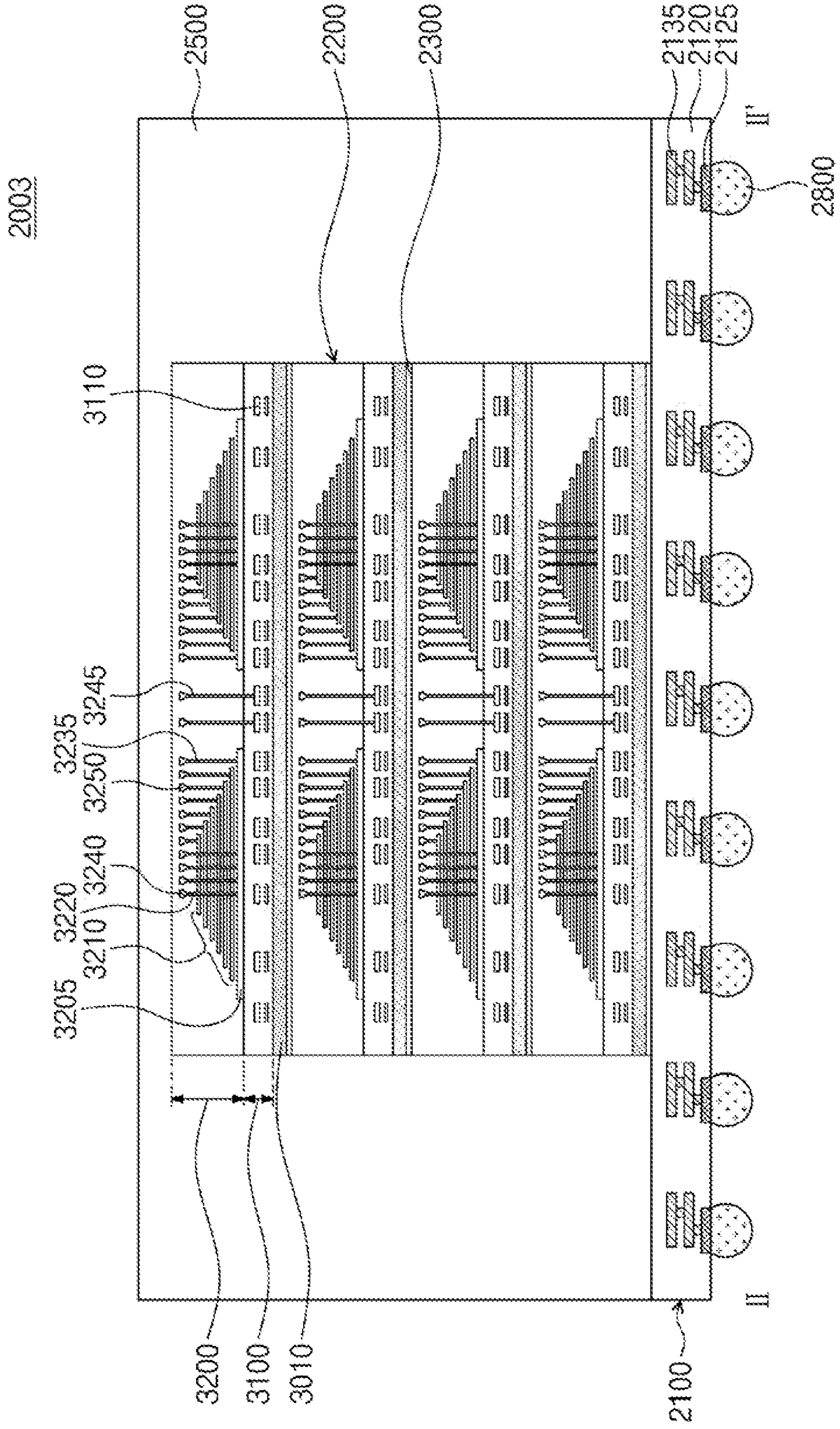

FIGS. 3 and 4 are sectional views, which are respectively taken along lines I-I' and II-II' of FIG. 2, or a semiconductor package including a three-dimensional semiconductor memory device according to an embodiment.

Referring to FIGS. 3 and 4, the semiconductor package 2003 may include the package substrate 2100, a plurality of the semiconductor chips 2200 on the package substrate 2100, and the molding layer 2500 covering the package substrate 2100 and the semiconductor chips 2200.

The package substrate 2100 may include a package substrate body portion 2120, the package upper pads 2130 on a top surface of the package substrate body portion 2120, lower pads 2125 on or exposed through a bottom surface of the package substrate body portion 2120, and internal lines 2135 in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 of FIG. 2 through conductive connecting portions 2800.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a common source line 3205, a gate stack 3210 on the common source line 3205, vertical channel structures 3220 and separation structures 3230 penetrating the gate stack 3210, bit lines 3240 electrically connected to the vertical channel structures 3220, gate interconnection lines 3235 electrically connected to word lines (e.g., WL of FIG. 1) of the gate stack 3210, and conductive lines 3250. Each of the gate interconnection lines 3235 may be electrically connected to a corresponding one of the word lines WL. At least one of the gate interconnection lines 3235 may be electrically connected to the common source line 3205.

Each of the semiconductor chips 2200 may include penetration lines 3245, which are electrically connected to the peripheral lines 3110 of the first structure 3100 and are extended into the second structure 3200. The penetration line 3245 may penetrate the gate stack 3210. In an implementation, the penetration line 3245 may be further included outside the gate stack 3210. Each of the semiconductor chips 2200 may further include an input/output interconnection line 3265, which extends into the second structure 3200 and is electrically connected to the peripheral line 3110 of the first structure 3100, and the input/output pad 2210, which is electrically connected to the input/output interconnection line 3265.

Figure 5A:
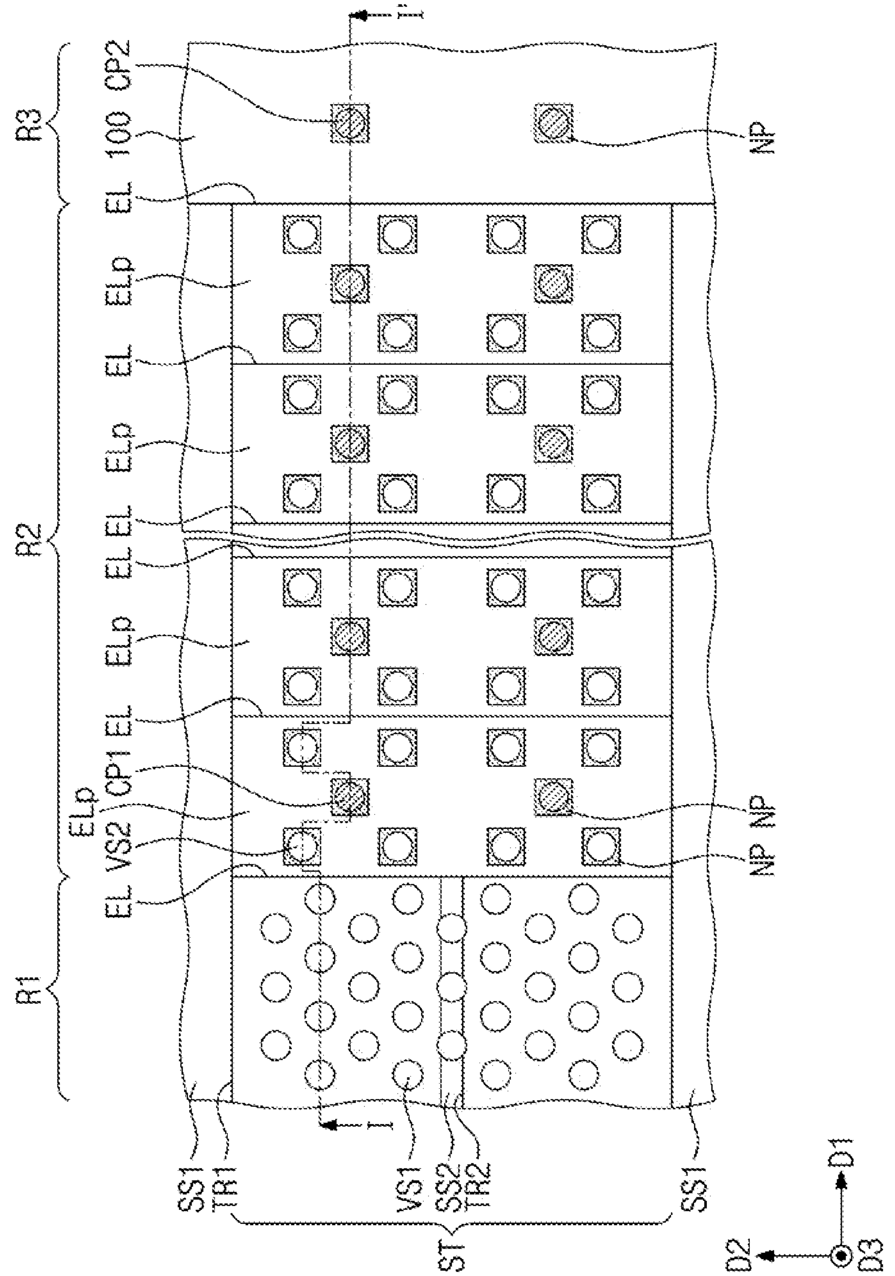
FIG. 5A is a plan view of a three-dimensional semiconductor memory device according to an embodiment.
Figure 5B:
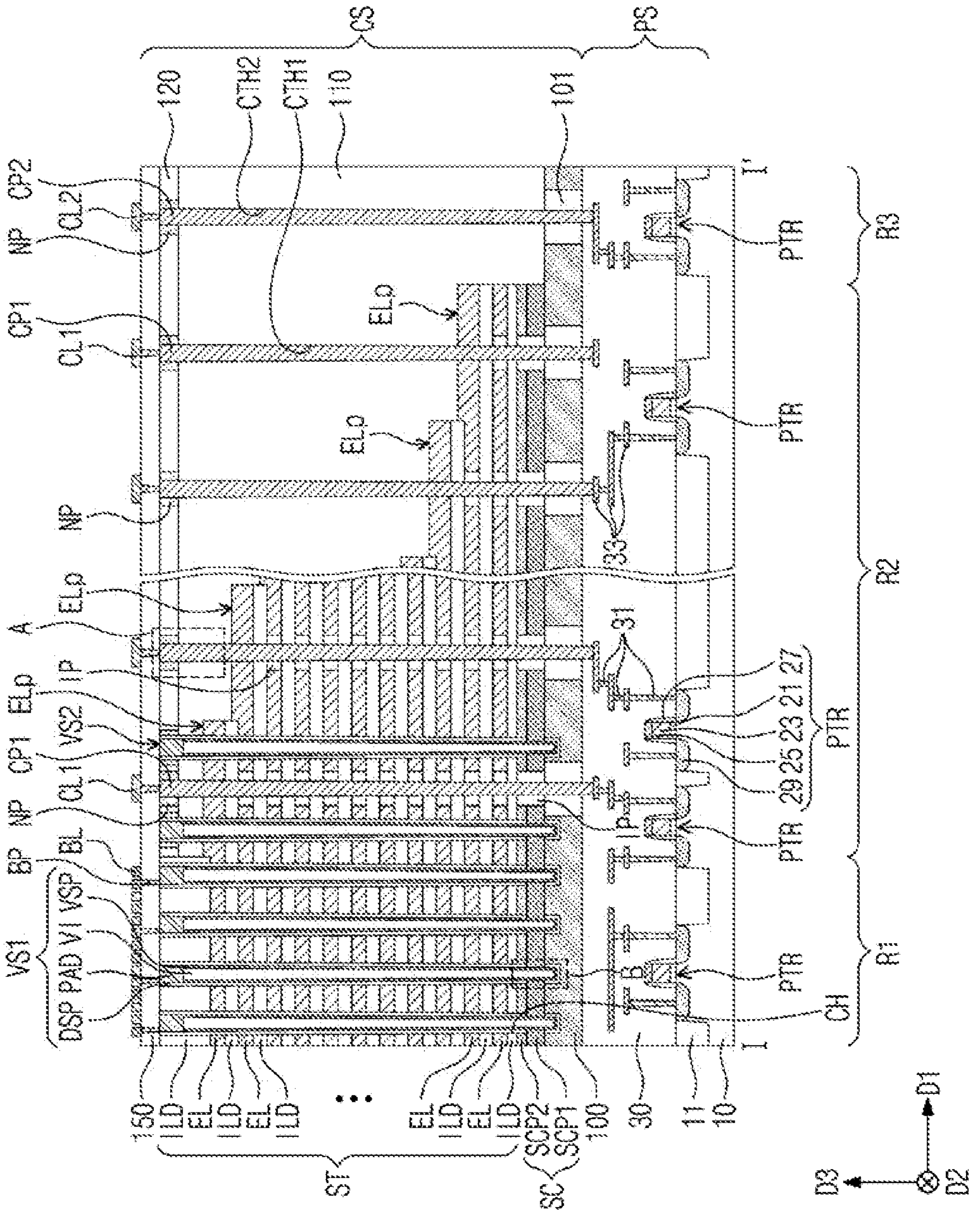
FIG. 5B is a sectional view, which is taken along a line I-I' of FIG. 5A of a three-dimensional semiconductor memory device according to an embodiment.

FIG. 5A is a plan view of a three-dimensional semiconductor memory device according to an embodiment. FIG. 5B is a sectional view, which is taken along a line I-I' of FIG. 5A, of a three-dimensional semiconductor memory device according to an embodiment.

Referring to FIGS. 5A and 5B, a first substrate 10 may include a first region R1, a second region R2, and a third region R3. The first substrate 10 may extend in a first direction D1, which is oriented from the first region R1 toward the third region R3, and in a second direction D2, which is not parallel to the first direction D1 (e.g., may have a main surface in a plane of the first direction D1 and the second direction D2). A top surface of the first substrate 10 may be normal to a third direction D3 that is not parallel to the first and second directions D1 and D2. In an implementation, the first, second, and third directions D1, D2, and D3 may be orthogonal to each other.

The second region R2 may extend from the first region R1 in the first direction D1. The third region R3 may extend from the second region R2 in the first direction D1. The first region R1 may be a region, on which the vertical channel structures 3220, the separation structures 3230, and the bit lines 3240 described with reference to FIGS. 3 and 4 may be provided. The second region R2 may be a region, on which a staircase structure of a stack ST may be provided. The third region R3 may be a region, on which the penetration line 3245 or the input/output connection line 3265 of FIGS. 3 and 4 may be provided.

In an implementation, the first substrate 10 may be a silicon substrate, a silicon germanium substrate, a germanium substrate, or a structure including a single-crystalline silicon substrate and a single-crystalline epitaxial layer grown therefrom. A device isolation layer 11 may be in the first substrate 10. The device isolation layer 11 may define an active region of the first substrate 10. The device isolation layer 11 may be formed of or include, e.g., silicon oxide.

A peripheral circuit structure PS may be on the first substrate 10. The peripheral circuit structure PS may include peripheral circuit transistors PTR on the active region of the first substrate 10, peripheral circuit contact plugs 31, peripheral circuit interconnection lines 33 electrically connected to the peripheral circuit transistors PTR through the peripheral circuit contact plugs 31, and a first insulating layer 30 enclosing them. The peripheral circuit structure PS may correspond to the first region 1100F of FIG. 1, and the peripheral circuit interconnection lines 33 may correspond to the peripheral lines 3110 of FIGS. 3 and 4.

The peripheral circuit transistors PTR, the peripheral circuit contact plugs 31, and the peripheral circuit interconnection lines 33 may constitute a peripheral circuit. In an implementation, the peripheral circuit transistors PTR may constitute the decoder circuit 1110, the page buffer 1120, and the logic circuit 1130 of FIG. 1. In an implementation, each of the peripheral circuit transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be between the peripheral gate electrode 23 and the first substrate 10. The peripheral capping pattern 25 may be on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be in portions of the first substrate 10, which are at both sides of the peripheral gate electrode 23.

The peripheral circuit interconnection lines 33 may be electrically connected to the peripheral circuit transistors PTR through the peripheral circuit contact plugs 31. Each of the peripheral circuit transistors PTR may be an NMOS transistor or a PMOS transistor, e.g., it may be a gate-all-around type transistor. In an implementation, as a distance from the first substrate 10 increases, a width of the peripheral circuit contact plug 31 may increase. The peripheral circuit contact plugs 31 and the peripheral circuit interconnection lines 33 may be formed of or include conductive or metallic materials.

The first insulating layer 30 may be on the top surface of the first substrate 10. The first insulating layer 30 may be on the first substrate 10 to cover the peripheral circuit transistors PTR, the peripheral circuit contact plugs 31, and the peripheral circuit interconnection lines 33. The first insulating layer 30 may be a multi-layered structure including a plurality of insulating layers. In an implementation, the first insulating layer 30 may be formed of or include, e.g., silicon oxide, silicon nitride, or silicon oxynitride. As used herein, the term "or" is not an exclusive term, e.g., "A or B" would include A, B, or A and B.

A cell array structure CS, which includes a second substrate 100, a stack ST, first and second vertical channel structures VS1 and VS2, and first and second contact plugs CP1 and CP2, may be on the peripheral circuit structure PS. Hereinafter, the cell array structure CS will be described in more detail below.

The second substrate 100 and lower insulating patterns 101 may be on the first insulating layer 30. The second substrate 100 may extend in the first and second directions D1 and D2. The second substrate 100 may be a semiconductor substrate including a semiconductor material. The second substrate 100 may be formed of or include, e.g., silicon (Si), germanium (Ge), silicon germanium (SiGe), gallium arsenic (GaAs), indium gallium arsenic (InGaAs), or aluminum gallium arsenic (AlGaAs).

The lower insulating patterns 101 may define positions of the first and second contact plugs CP1 and CP2. The lower insulating patterns 101 may be between the first insulating layer 30 and a source structure SC to be described below. When viewed in a plan view, each of the lower insulating patterns 101 may be enclosed or surrounded by the second substrate 100. A top surface of each of the lower insulating patterns 101 may be substantially coplanar with a top surface of the second substrate 100, and a bottom surface of each of the lower insulating patterns 101 may be substantially coplanar with a bottom surface of the second substrate 100 and a top surface of the first insulating layer 30. In an implementation, the lower insulating patterns 101 may be formed of or include, e.g., silicon oxide, silicon nitride, or silicon oxynitride.

The stack ST may be on the second substrate 100 and the lower insulating patterns 101. The stack ST may extend from the first region R1 toward the second region R2 or in the first direction D1. The stack ST may correspond to the stacks 3210 of FIGS. 3 and 4.

A plurality of the stacks ST may be provided. In an implementation, the stacks ST may be arranged in the second direction D2. When viewed in a plan view, first separation structures SS1 may be in first trenches TR1, which may be between the stacks ST to cross the stacks ST in the first direction D1. The first separation structures SS1 may extend from the first region R1 to the second region R2. The first separation structures SS1 may be on opposite side surfaces of one of the stacks ST. The stacks ST, which are adjacent to each other in the second direction D2, may be spaced apart from each other in the second direction D2 by one of the first separation structures SS1 therebetween.

A second separation structure SS2 may be in a second trench TR2, which is between the first separation structures SS1 and extends in the first direction D1. The second separation structure SS2 may cross an upper portion of the stack ST. The second separation structure SS2 may be on the first region R1. In an implementation, a plurality of second separation structures SS2 may be between the first separation structures SS1. In an implementation, the second separation structure SS2 may include a portion, which extends from the first region R1 and is on a portion of the second region R2. In an implementation, the first and second separation structures SS1 and SS2 may be formed of or include, e.g., silicon oxide, silicon nitride, or silicon oxynitride.

For convenience in description, one of the stacks ST and one of the first separation structures SS1 will be described in more detail below, and the others of the stacks ST and the others of the first separation structures SS1 may be configured to have the same features.

The stack ST may include interlayer insulating layers ILD, which are stacked on the second substrate 100, and gate electrodes EL, which are between the interlayer insulating layers ILD. The interlayer insulating layers ILD and the gate electrodes EL may be alternately and repeatedly stacked on the second substrate 100. The gate electrodes EL may correspond to the first lines LL1 and LL2, the word lines WL, and the second lines UL1 and UL2 of FIG. 1.

As a height from the second substrate 100 (e.g., in the third direction D3) increases, lengths of the gate electrodes EL in the first direction D1 may decrease. In an implementation, a length of each of the gate electrodes EL in the first direction D1 may be larger than a length in the first direction D1 of another gage electrode thereon. In an implementation, a lowermost one of the gate electrodes EL may have the largest length in the first direction D1, and an uppermost one of the gate electrodes EL may have the smallest length in the first direction D1.

The gate electrodes EL may have pad portions ELp on the second region R2. The pad portions ELp of the gate electrodes EL may be at positions that are horizontally and vertically different from each other. Each of the pad portions ELp may be thicker than other portion of a corresponding one of the gate electrodes EL. A top surface of each of the pad portions ELp of one gate electrode EL may be at a level higher (e.g., farther from the first substrate 10 in the third direction D3) than a top surface of other portions of that one gate electrode EL. Each of the pad portions ELp may cover at least a portion of a side surface of the interlayer insulating layer ILD thereon.

The pad portions ELp may form a staircase structure in the first direction D1. Due to the staircase structure, the stack ST may have a decreasing thickness, with increasing distance from the first vertical channel structures VS1, and when viewed in a plan view, side surfaces of the gate electrodes EL may be spaced apart from each other in the first direction D1 by a specific distance.

The gate electrodes EL may be formed of or include, e.g., doped semiconductor materials (e.g., doped silicon or the like), metallic materials (e.g., tungsten, copper, aluminum, or the like), conductive metal nitrides (e.g., titanium nitride, tantalum nitride, or the like), or transition metals (e.g., titanium, tantalum, or the like).

The interlayer insulating layers ILD may be between the gate electrodes EL. As a distance from the second substrate 100 increases, lengths of the interlayer insulating layers ILD in the first direction D1 may decrease, similar to the gate electrodes EL.

In an implementation, a thickness of each of the interlayer insulating layers ILD may be smaller than a thickness of each of the gate electrodes EL. In the present specification, a thickness of an element may mean a length of the element measured in the third direction D3. In an implementation, a thickness of the lowermost one of the interlayer insulating layers ILD may be smaller than a thickness of each of the others of the interlayer insulating layers ILD. In an implementation, a thickness of the uppermost one of the interlayer insulating layers ILD may be larger than the thickness of each of the others of the interlayer insulating layers ILD. In an implementation, the thicknesses of the interlayer insulating layers ILD may be variously changed, depending on technical properties for each semiconductor device. The interlayer insulating layers ILD may be formed of or include, e.g., silicon oxide, silicon nitride, or silicon oxynitride.

The source structure SC may be between the second substrate 100 and the stack ST. The second substrate 100 and the source structure SC may correspond to the common source line CSL of FIG. 1 and the common source line 3205 of FIGS. 3 and 4.

The source structure SC may extend parallel to the gate electrodes EL of the stack ST or in the first and second directions D1 and D2. The source structure SC may extend from the first region R1 to the second region R2 and may not be on the third region R3. The source structure SC may include a first source conductive pattern SCP1 and a second source conductive pattern SCP2, which are sequentially stacked. The second source conductive pattern SCP2 may be between the first source conductive pattern SCP1 and the lowermost one of the interlayer insulating layers ILD. A thickness of the first source conductive pattern SCP1 may be larger than a thickness of the second source conductive pattern SCP2 (e.g., as measured in the third direction D3). Each of the first and second source conductive patterns SCP1 and SCP2 may be formed of or include a doped semiconductor material. In an implementation, an impurity concentration of the first source conductive pattern SCP1 may be higher than an impurity concentration of the second source conductive pattern SCP2.

The first vertical channel structures VS1 may be on the first region R1, may penetrate the stack ST and the source structure SC, and may be in contact with the second substrate 100. Each of the first vertical channel structures VS1 may penetrate at least a portion of the second substrate 100, and a bottom surface of each of the first vertical channel structures VS1 may be at a level lower than the top surface of the second substrate 100 and a bottom surface of the source structure SC. The first vertical channel structures VS1 may be in vertical channel holes CH that penetrate the stack ST and the source structure SC. As a height in the third direction D3 increases, a width of each of the first vertical channel structures VS1 may also increase.

When viewed in a plan view, the first vertical channel structures VS1 may be arranged to form a zigzag shape in the first or second direction D1 or D2. The first vertical channel structures VS1 may not be on the second region R2. The first vertical channel structures VS1 may be between the first separation structures SS1. In an implementation, some of the first vertical channel structures VS1 may overlap with the second separation structure SS2 in the third direction D3. The first vertical channel structures VS1 may correspond to the vertical channel structures 3220 of FIGS. 2 to 4. The first vertical channel structures VS1 may correspond to the channel regions of the first transistors LT1 and LT2, the memory cell transistors MCT, and the second transistors UT1 and UT2 of FIG. 1.

Each of the first vertical channel structures VS1 may include a data storage pattern DSP, which is adjacent to the stack ST (e.g., covering an inner side surface of each of the vertical channel holes CH), a vertical semiconductor pattern VSP, which conformally covers an inner side surface of the data storage pattern DSP, a gapfill insulating pattern VI, which fills an internal space of the vertical semiconductor pattern VSP, and a conductive pad PAD, which is in a space enclosed by the gapfill insulating pattern VI and the data storage pattern DSP. In an implementation, a top surface of each of the first vertical channel structures VS1 may have a circular, elliptical, or bar shape.

The vertical semiconductor pattern VSP may be between the data storage pattern DSP and the gapfill insulating pattern VI. The vertical semiconductor pattern VSP may be shaped like a bottom-closed pipe or macaroni. In an implementation, the vertical semiconductor pattern VSP may be in contact with a portion of the source structure SC. The vertical semiconductor pattern VSP may be formed of or include polysilicon.

The data storage pattern DSP may be shaped like a bottom-opened pipe or macaroni. The data storage pattern DSP may include a plurality of insulating layers, which are sequentially stacked. The gapfill insulating pattern VI may be formed of or include, e.g., silicon oxide. In an implementation, the conductive pad PAD may be formed of or include, e.g., doped semiconductor materials or conductive materials.

A plurality of second vertical channel structures VS2 may be on the second region R2 and may penetrate second and third insulating layers 110 and 120 (to be described below), the stack ST, and the source structure SC. In an implementation, the second vertical channel structures VS2 may penetrate the pad portions ELp of the gate electrodes EL. The second vertical channel structures VS2 may be around or adjacent to first contact plugs CP1 to be described below. The second vertical channel structures VS2 may not be on the first region R1. The second vertical channel structures VS2 may be dummy channel structures, which are not used as a part of a memory cell.

The second vertical channel structures VS2 may be formed concurrently with the first vertical channel structures VS1. The second vertical channel structures VS2 may have substantially the same structure as the first vertical channel structures VS1.

A second insulating layer 110 may be on the second region R2 to cover the staircase structure of the stack ST. A third insulating layer 120 may be on the second insulating layer 110. The third insulating layer 120 may have a substantially flat top surface. The top surface of the third insulating layer 120 may be substantially coplanar with the topmost surface of the stack ST (e.g., a top surface of the uppermost one of the interlayer insulating layers ILD). A bottom surface of the third insulating layer 120 may be at a level higher than a bottom surface of the uppermost one of the interlayer insulating layers ILD.

In an implementation, each of the second and third insulating layers 110 and 120 may be formed of or include, e.g., silicon oxide, silicon nitride, or silicon oxynitride. The third insulating layer 120 may be formed of or include, e.g., doped silicon oxide.

The first contact plugs CP1 may be on the second region R2 and may penetrate the second and third insulating layers 110 and 120, the stack ST, the source structure SC, and one of the lower insulating patterns 101. Each of the first contact plugs CP1 may be in contact with one of the peripheral circuit interconnection lines 33 of the peripheral circuit structure PS and may be electrically connected to at least one of the peripheral circuit transistors PTR. Each of the first contact plugs CP1 may be near the second vertical channel structures VS2, but may be spaced apart from the second vertical channel structures VS2. A height of each of the first contact plugs CP1 in the third direction D3 may be larger than a height of the stack ST in the third direction D3. A top surface of each of the first contact plugs CP1 may be substantially coplanar with the top surface of the third insulating layer 120. A bottom surface of each of the first contact plugs CP1 may be at a level lower than the bottom surface of the second substrate 100 and the bottom surfaces of the lower insulating patterns 101. The first contact plugs CP1 may correspond to the gate interconnection lines 3235 of FIG. 4.

Each of the first contact plugs CP1 may be electrically connected to a corresponding one of the gate electrodes EL (e.g., a corresponding one of the pad portions ELp exposed by the staircase structure) in a contact manner. Each of the first contact plugs CP1 may be horizontally spaced apart from the gate electrodes EL and the source structure SC, which are below the pad portions ELp, by insulating separation patterns IP therebetween. In an implementation, each of the first contact plugs CP1 may be electrically connected to a corresponding one of the gate electrodes EL and may be electrically disconnected from the others of the gate electrodes EL.

The second contact plug CP2 may be on the third region R3 and may penetrate the second and third insulating layers 110 and 120 and one of the lower insulating patterns 101. The second contact plug CP2 may be in contact with one of the peripheral circuit interconnection lines 33 of the peripheral circuit structure PS and may be electrically connected to at least one of the peripheral circuit transistors PTR. The second contact plug CP2 may be spaced apart from a side surface of the stack ST (e.g., a side surface of the lowermost one of the gate electrodes EL) and a side surface of the source structure SC in the first direction D1. A height of the second contact plug CP2 in the third direction D3 may be substantially equal to a height of each of the first contact plugs CP1 in the third direction D3. A top surface of the second contact plug CP2 may be substantially coplanar with the top surface of the third insulating layer 120. A bottom surface of the second contact plug CP2 may be at a level lower than the bottom surface of the second substrate 100 and the bottom surfaces of the lower insulating patterns 101. The second contact plug CP2 may correspond to the penetration lines 3245 or the input/output interconnection line 3265 described with reference to FIGS. 3 and 4. In an implementation, a plurality of second contact plugs CP2 may be on the third region R3.

As a height in the third direction D3 increases, a width of each of the first and second contact plugs CP1 and CP2 may increase. The first and second contact plugs CP1 and CP2 may be formed of or include, e.g., conductive or metallic materials.

Insulating pads NP may be in the third insulating layer 120 and may enclose or surround respective upper portions of the second vertical channel structures VS2 and the first and second contact plugs CP1 and CP2. In the present specification, the insulating pads NP enclosing the upper portions of the first contact plugs CP1 may be referred to as first insulating pads, the insulating pads NP enclosing the upper portions of the second vertical channel structures VS2 may be referred to as second insulating pads, and the insulating pad NP enclosing the upper portion of the second contact plug CP2 may be referred to as a third insulating pad.

When viewed in a plan view, each of the insulating pads NP may be enclosed by the third insulating layer 120. The insulating pads NP may overlap with the stack ST and the first vertical channel structures VS1 in a horizontal direction. Top surfaces of the insulating pads NP may be at the same level as the top surfaces of the first and second vertical channel structures VS1 and VS2, the top surfaces of the first and second contact plugs CP1 and CP2, and the topmost surface of the stack ST (e.g., the top surface of the uppermost one of the interlayer insulating layers ILD). The top surfaces of the insulating pads NP may be substantially coplanar with the top surface of the third insulating layer 120. Bottom surfaces of the insulating pads NP may be at a level that is higher than the bottom surface of the uppermost one of the interlayer insulating layers ILD. The bottom surfaces of the insulating pads NP may be substantially coplanar with the bottom surface of the third insulating layer 120. The insulating pads NP may be formed of or include an insulating material different from the second and third insulating layers 110 and 120. In an implementation, the second and third insulating layers 110 and 120 may be formed of or include silicon oxide, and the insulating pads NP may be formed of or include silicon nitride.

A fourth insulating layer 150 may be on the stack ST and the third insulating layer 120. In an implementation, the fourth insulating layer 150 may be formed of or include, e.g., silicon oxide, silicon nitride, or silicon oxynitride. The fourth insulating layer 150 may be formed of or include, e.g., an insulating material different from the insulating pads NP.

Bit line contact plugs BP may be on the first region R1 and may penetrate the fourth insulating layer 150. Each of the bit line contact plugs BP may be electrically connected to the conductive pad PAD of each of the first vertical channel structures VS1. As a distance or height in the third direction D3 increases, each of the bit line contact plugs BP may have an increasing width. The bit line contact plugs BP may be formed of or include, e.g., conductive or metallic materials.

Bit lines BL, first conductive lines CL1, and a second conductive line CL2, which are electrically connected to the bit line contact plugs BP, the first contact plugs CP1, and the second contact plug CP2, respectively, may be on the fourth insulating layer 150. Each of the first vertical channel structures VS1 may overlap with a pair of the bit lines BL in the third direction D3 and may be electrically connected to one of them. The bit lines BL and the first and second conductive lines CL1 and CL2 may be formed of or include conductive or metallic materials. The bit lines BL may correspond to the bit line BL of FIG. 1 and the bit lines 3240 of FIGS. 3 and 4, and the first and second conductive lines CL1 and CL2 may correspond to the conductive lines 3250 of FIG. 4. In an implementation, the second conductive line CL2 may be electrically connected to an element that is used as the input/output pad 1101 of FIG. 1 or the input/output pads 2210 of FIGS. 2 and 3.

An additional insulating layer and additional interconnection lines therein may be on the fourth insulating layer 150 to cover the bit lines BL and the first and second conductive lines CL1 and CL2.

Figure 6A:
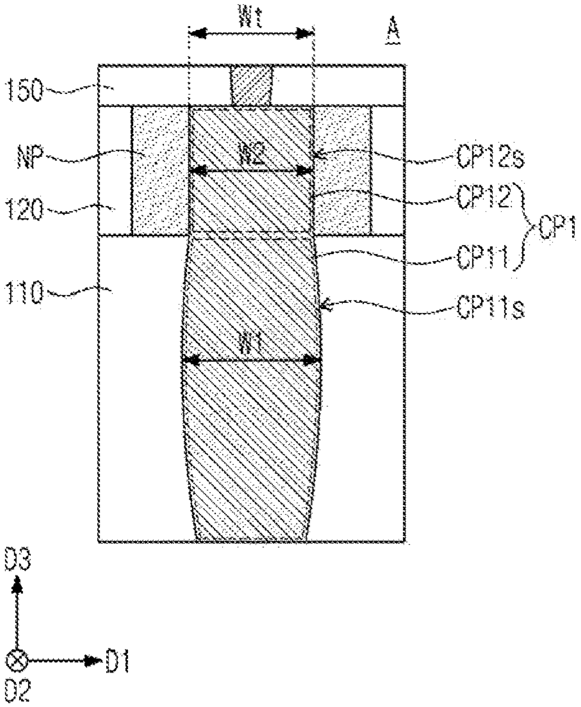
FIGS. 6A and 6B are enlarged sectional views, each of which illustrates a portion (e.g., 'A' of FIG. 5B) of a three-dimensional semiconductor memory device according to an embodiment.

FIG. 6A is an enlarged sectional view of a portion (e.g., 'A' of FIG. 5B) of a three-dimensional semiconductor memory device according to an embodiment.

FIG. 6A illustrates a portion of one of the first contact plugs CP1 and one of the insulating pads NP. The first contact plugs CP1, the second contact plug CP2, and the second vertical channel structures VS2 may have substantially the same features as one of the first contact plugs CP1 to be described with reference to FIG. 6A. In addition, the insulating pads NP may have the same features as one of the insulating pads NP to be described with reference to FIG. 6A.

The first contact plug CP1 may include a first portion CP11 and a second portion CP12 on the first portion CP11. The first portion CP11 may be a portion of the first contact plug CP1 enclosed or surrounded by the second insulating layer 110, and the second portion CP12 may be a portion of the first contact plug CP1 enclosed or surrounded by the third insulating layer 120 or the insulating pad NP.

A side surface CP11*s* of the first portion CP11 may be covered with the second insulating layer 110. The side surface CP11*s* of the first portion CP11 may have a convexly (e.g., outwardly) curved profile (e.g., bow profile). The first portion CP11 may have a first width W1, which is defined as a width measured in a horizontal direction (e.g., the first direction D1). In an implementation, the first width W1 may increase and then decrease, when measured while changing a height in the third direction D3. In an implementation, a point, at which the first width W1 has a largest value, may be at a level lower than a bottom surface of the insulating pad NP.

A side surface CP12*s* of the second portion CP12 may be covered with the insulating pad NP. The side surface CP12*s* of the second portion CP12 may have a linear profile. The second portion CP12 may have a second width W2, which is defined as a width measured in a horizontal direction (e.g., the first direction D1). In an implementation, the second width W2 may be substantially constant regardless of a height in the third direction D3. The second width W2 may be smaller than the largest value of the first width W1. The largest value of the second width W2 may be smaller than or equal to the uppermost width of the first portion CP11.

In an implementation, the second width W2 may be monotonically decreased, when measured while changing a height in the third direction D3. In this case, the uppermost width Wt of the second portion CP12 may be smaller than a mean value of the second width W2.

In an implementation, the second width W2 may be monotonically increased, when measured while changing a height in the third direction D3. In this case, the uppermost width Wt of the second portion CP12 may be larger than the mean value of the second width W2. Even in such a case, the uppermost width Wt of the second portion CP12 may be smaller than the largest value of the first width W1.

In an implementation, a ratio of the largest value of the first width W1 to the uppermost width Wt of the second portion CP12 may range from, e.g., about 100% to about 110%. In an implementation, the ratio of the largest value of the first width W1 to the uppermost width Wt of the second portion CP12 may range from, e.g., about 100% to about 105%. In an implementation, the uppermost width Wt of the second portion CP12 may range from, e.g., about 90 nm to about 120 nm.

The insulating pad NP may enclose the second portion CP12 of the first contact plug CP1, and it may be possible to help prevent or suppress a bowing phenomenon of the first contact plug CP1, in which a ratio of the largest value of the first width W1 to the uppermost width Wt of the second portion CP12 is increased to a value greater than 100%, to help prevent or suppress the side surface CP12*s* of the second portion CP12 of the first contact plug CP1 from being inclined to the third direction D3, and to help reduce a variation in the uppermost widths Wt of the first contact plugs CP1. Accordingly, it may be possible to help prevent or suppress a bridge pattern from being formed between adjacent ones of the first and second contact plugs CP1 and CP2 and the second vertical channel structures VS2 and to easily control a height, in the third direction D3, of each of the first and second contact plugs CP1 and CP2 and the second vertical channel structures VS2. As a result, electric and reliability characteristics of the three-dimensional semiconductor memory device may be improved.

Figure 6B:
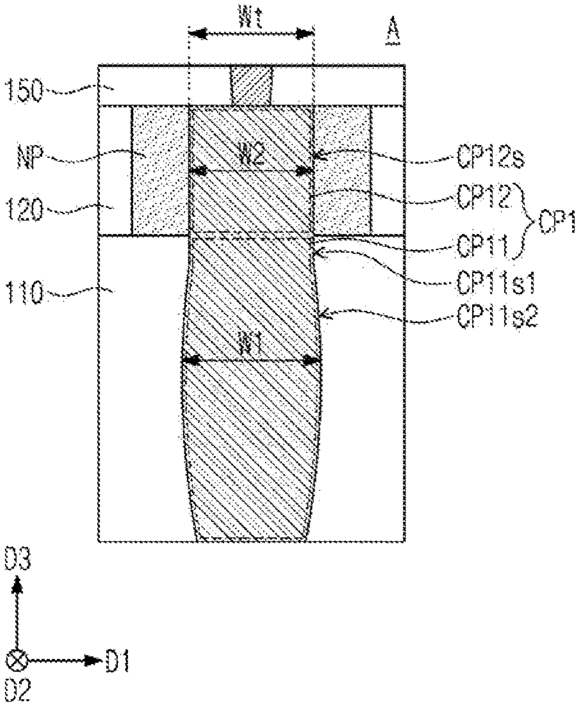

FIG. 6B is an enlarged sectional view of a portion (e.g., 'A' of FIG. 5B) of a three-dimensional semiconductor memory device according to an embodiment. In the following description, an element previously described with reference to FIGS. 5B and 6A may be identified by the same reference number without repeating an overlapping description thereof, for concise description.

Referring to FIGS. 5B and 6B, a side surface of the first portion CP11 of the first contact plug CP1 may include a first side surface CP11*s*1 and a second side surface CP11*s*2. The first side surface CP11*s*1 may be connected to or continuous with the side surface CP12*s* of the second portion CP12 without any stepwise portion (e.g., with the same slope). The second side surface CP11*s*2 may extend from the first side surface CP11*s*1 in a downward direction. The first side surface CP11*s*1 may have a linear profile, similar to the side surface CP12*s* of the second portion CP12, and the second side surface CP11*s*2 may have a convexly curved profile (e.g., bow profile).

When measured while changing a height in the third direction D3, the first width W1 of the first portion CP11 may be constant in a range corresponding to the first side surface CP11*s*1, and the first width W1 of the first portion CP11 may increase and then decrease in a range corresponding to the second side surface CP11*s*2.

Figure 7:
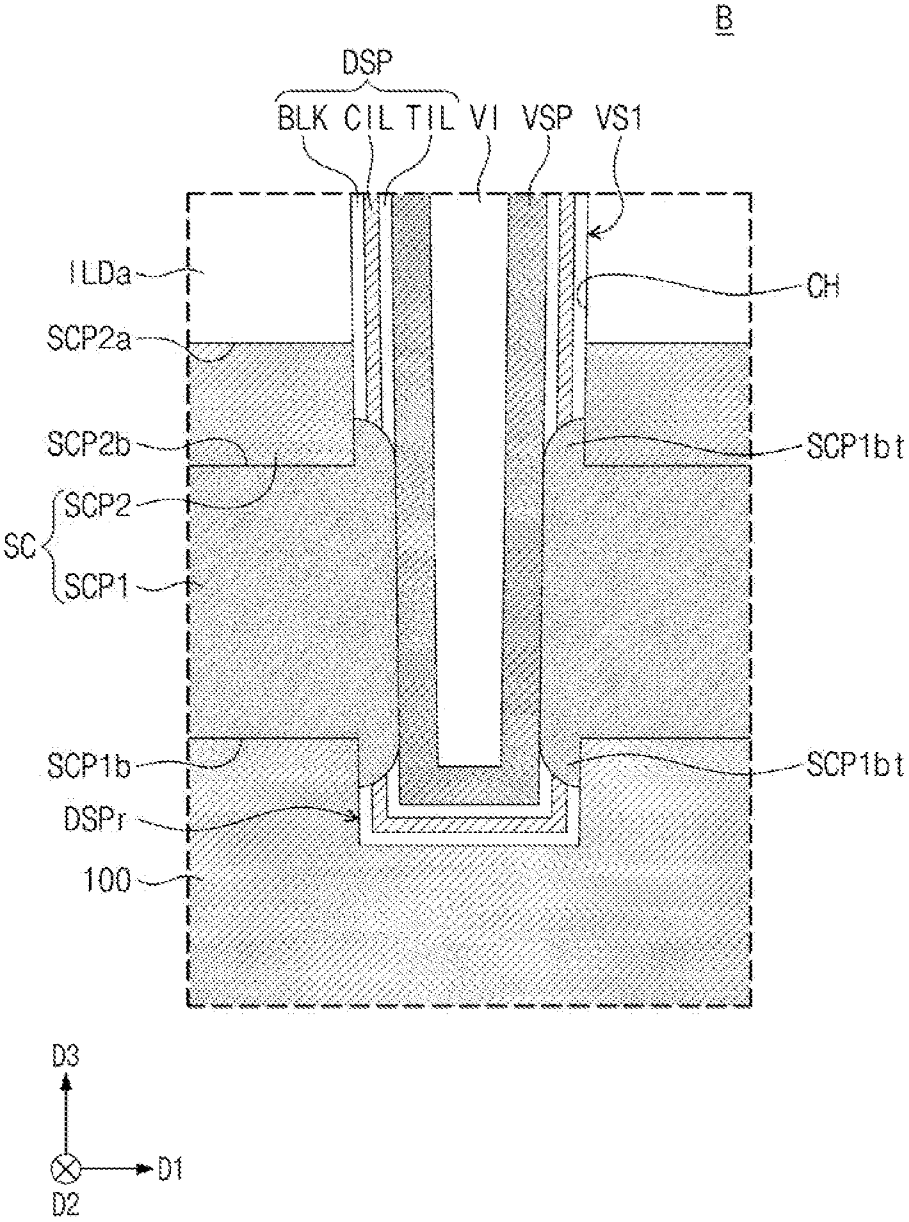
FIG. 7 is an enlarged sectional view of a portion (e.g., 'B' of FIG. 5B) of a three-dimensional semiconductor memory device according to an embodiment.

FIG. 7 is an enlarged sectional view of a portion (e.g., 'B' of FIG. 5B) of a three-dimensional semiconductor memory device according to an embodiment.

As shown in FIGS. 5B and 7, the source structure SC may include the first and second source conductive patterns SCP1 and SCP2, and each of the first vertical channel structures VS1 may include the data storage pattern DSP, the vertical semiconductor pattern VSP, the gapfill insulating pattern VI, and a lower data storage pattern DSPr. For convenience in description, one of the stacks ST and one of the first vertical channel structures VS1 will be described below, but the remaining ones of the stacks ST and the first vertical channel structures VS1 may have substantially the same features as those described below.

The data storage pattern DSP may include a blocking insulating layer BLK, a charge storing layer CIL, and a tunneling insulating layer TIL, which are sequentially stacked. The blocking insulating layer BLK may be adjacent to the stack ST or the source structure SC, and the tunneling insulating layer TIL may be adjacent to the vertical semiconductor pattern VSP. The charge storing layer CIL may be between the blocking insulating layer BLK and the tunneling insulating layer TIL. The blocking insulating layer BLK may cover an inner side surface of each of the vertical channel holes CH.

The blocking insulating layer BLK, the charge storing layer CIL, and the tunneling insulating layer TIL may extend from a region between the stack ST and the vertical semiconductor pattern VSP in the third direction D3. In an implementation, a Fowler-Nordheim (FN) tunneling phenomenon, which is caused by a voltage difference between the vertical semiconductor pattern VSP and the gate electrodes EL, may be used to store or change data in the data storage pattern DSP. In an implementation, the blocking insulating layer BLK and the tunneling insulating layer TIL may be formed of or include silicon oxide, and the charge storing layer CIL may be formed of or include silicon nitride or silicon oxynitride.

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP therebetween. The first source conductive pattern SCP1 may be spaced apart from the gapfill insulating pattern VI with the vertical semiconductor pattern VSP therebetween.

In an implementation, the first source conductive pattern SCP1 may include protruding portions SCP1*bt* which are at a level higher than a bottom surface SCP2*b* of the second source conductive pattern SCP2 or lower than a bottom surface SCP1*b* of the first source conductive pattern SCP1. In an implementation, the protruding portions SCP1*bt* may be at a level lower than a top surface SCP2*a* of the second source conductive pattern SCP2. A surface of the protruding portion SCP1*bt*, which is in contact with the data storage pattern DSP or the lower data storage pattern DSPr, may have a curved shape.

Figure 8:
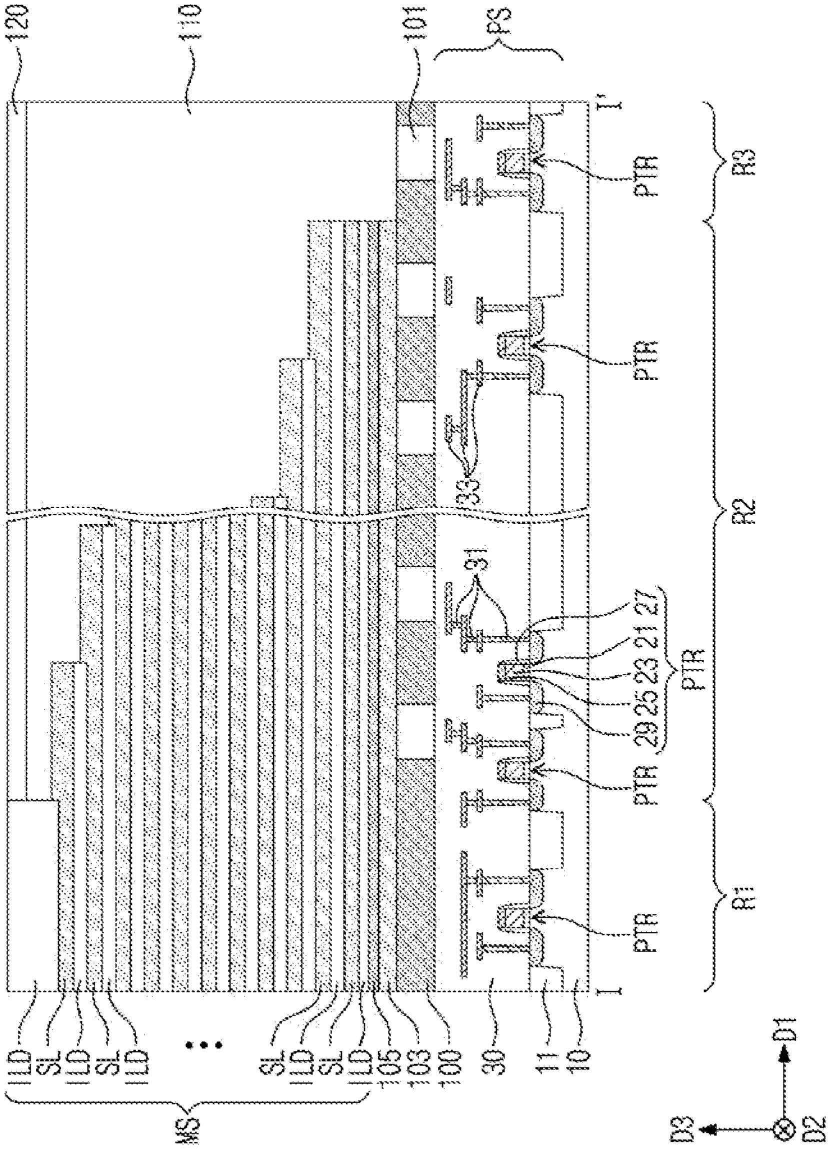
FIGS. 8, 9, and 10 are sectional views, which are respectively taken along the line I-I' of FIG. 5A of stages in a method of fabricating a three-dimensional semiconductor memory device according to an embodiment.
Figure 9:
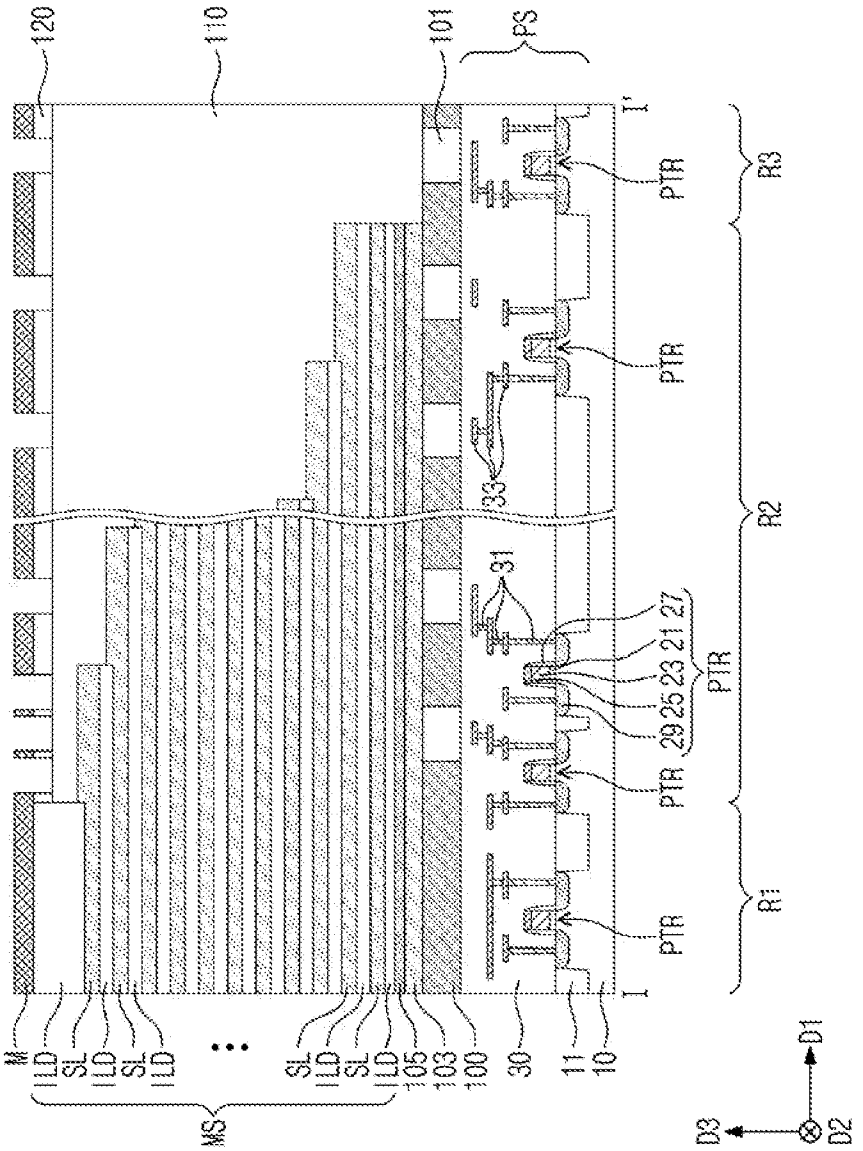
Figure 10:
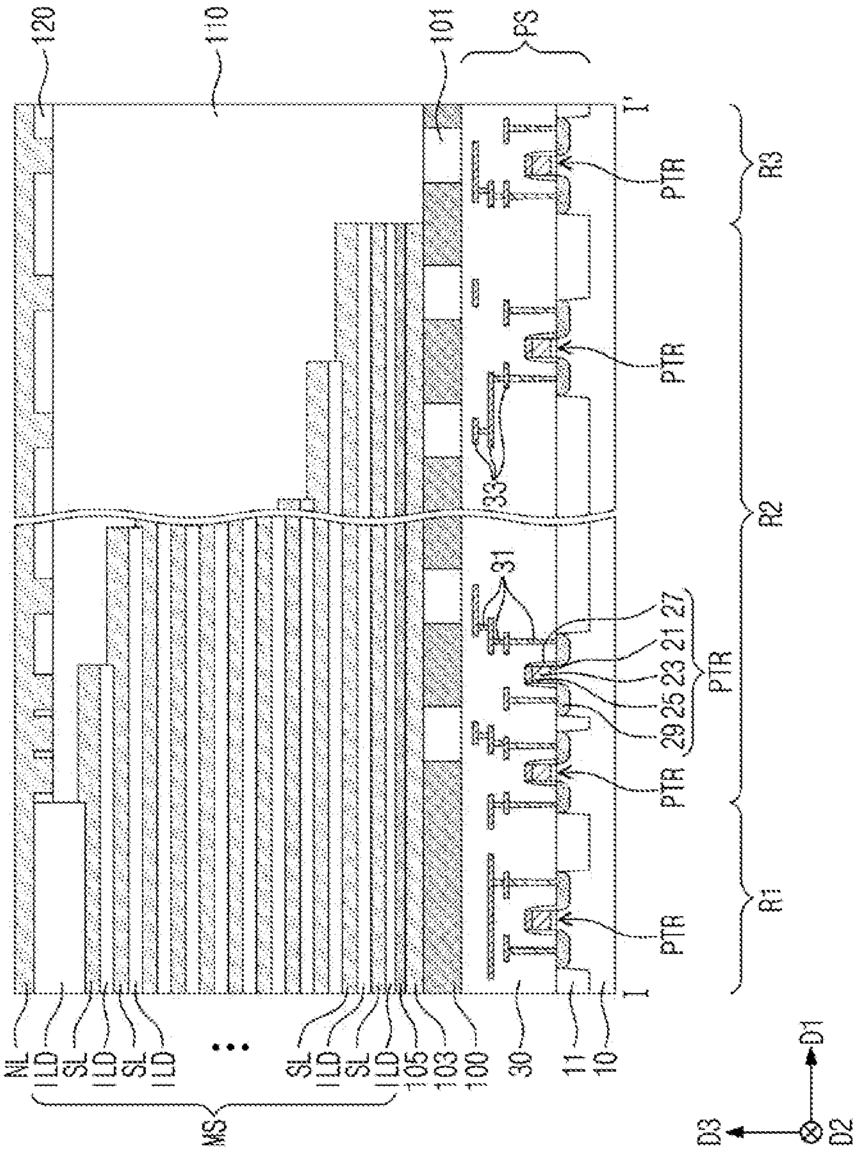

FIGS. 8, 9, and 10 are sectional views, which are respectively taken along the line I-I' of FIG. 5A, of stages in a method of fabricating a three-dimensional semiconductor memory device according to an embodiment. Hereinafter, a method of fabricating the three-dimensional semiconductor memory device of FIGS. 5A and 5B will be described in more detail with reference to FIGS. 8, 9, and 10.

Referring to FIG. 8, the first substrate 10 may include the first region R1, the second region R2, and the third region R3. The device isolation layer 11 may be formed in the first substrate 10 to define an active region. The formation of the device isolation layer 11 may include forming a trench in an upper portion of the first substrate 10 and filling the trench with silicon oxide.

The peripheral circuit transistors PTR may be formed on the active region defined by the device isolation layer 11. The peripheral circuit contact plugs 31 and the peripheral circuit interconnection lines 33, which are connected to the peripheral source/drain regions 29 of the peripheral circuit transistors PTR, may be formed on the first substrate 10. The first insulating layer 30 may be formed to cover the peripheral circuit transistors PTR, the peripheral circuit contact plugs 31, and the peripheral circuit interconnection lines 33.

The second substrate 100 and the lower insulating patterns 101 may be formed on the first insulating layer 30. The formation of the second substrate 100 and the lower insulating patterns 101 may include forming a semiconductor layer on the first insulating layer 30, patterning the semiconductor layer to expose a top surface of the first insulating layer 30, forming an insulating layer on the first insulating layer 30 and the semiconductor layer, and planarizing the insulating layer to expose a top surface of the semiconductor layer. As a result of the planarization process, the top surfaces of the lower insulating patterns 101 may be substantially coplanar with the top surface of the second substrate 100. In the following description, the description of two elements being substantially coplanar with each other may mean that a planarization process may be performed on the elements. The planarization process may be performed using, e.g., a chemical mechanical polishing (CMP) process or an etch-back process.

A lower sacrificial layer 103 and a lower semiconductor layer 105 may be sequentially formed on the second substrate 100 and the lower insulating patterns 101. In an implementation, the lower sacrificial layer 103 may be formed of or include silicon nitride. In an implementation, the lower sacrificial layer 103 may be formed by sequentially stacking a plurality of insulating layers. In an implementation, the lower semiconductor layer 105 may be formed of or include the same material as the second substrate 100.

A mold structure MS may be formed on the lower semiconductor layer 105. The formation of the mold structure MS may include alternately and repeatedly forming the interlayer insulating layers ILD and sacrificial layers SL on the lower semiconductor layer 105, performing a trimming process to form a staircase structure on the second region R2, and increasing a thickness of an end portion of each of the sacrificial layers SL. The trimming process may include forming a mask pattern to cover a top surface of the uppermost one of the interlayer insulating layers ILD, patterning the interlayer insulating layers ILD and the sacrificial layers SL using the mask pattern, reducing an area of the mask pattern, and patterning the interlayer insulating layers ILD and the sacrificial layers SL using the reduced mask pattern. The step of reducing the area of the mask pattern and the patterning step may be alternately repeated. As a result of the trimming process, the mold structure MS may have the staircase structure on the second region R2.

The second insulating layer 110 may be formed to cover the staircase structure of the mold structure MS on the second region R2 and the second substrate 100 on the third region R3. The third insulating layer 120 may be formed on the second insulating layer 110. The third insulating layer 120 may be substantially coplanar with the topmost surface of the mold structure MS (e.g., the top surface of the uppermost one of the interlayer insulating layers ILD).

Referring to FIG. 9, a mask pattern M may be formed on the mold structure MS and the third insulating layer 120. The mask pattern M may have a plurality of openings. At least some of the openings may overlap with the lower insulating patterns 101 in the third direction D3. The third insulating layer 120 exposed through the openings of the mask pattern M may be etched.

Referring to FIG. 10, an insulating pad layer NL may be formed to fill empty spaces, which are formed by removing the third insulating layer 120, and to cover the mold structure MS and the third insulating layer 120. The insulating pad layer NL may be formed of or include an insulating material that is different from the second and third insulating layers 110 and 120. In an implementation, the second and third insulating layers 110 and 120 may be formed of or include silicon oxide, and the insulating pad layer NL may be formed of or include silicon nitride.

Referring back to FIGS. 5A and 5B, the insulating pads NP may be formed by performing a planarization process on the insulating pad layer NL. The insulating pads NP may have top surfaces that are substantially coplanar with the top surface of the third insulating layer 120.

The vertical channel holes CH may be formed on the first region R1 to define spaces, in which the first vertical channel structures VS1 will be formed. Each of the vertical channel holes CH may be formed to penetrate the mold structure MS, the lower semiconductor layer 105, and the lower sacrificial layer 103 and to expose the second substrate 100.

First contact holes CTH1 may be formed on the second region R2 to define spaces, in which the first contact plugs CP1 will be formed. A second contact hole CTH2 may be formed on the third region R3 to define a space, in which the second contact plug CP2 will be formed. Each of the first contact holes CTH1 may be formed to penetrate one of the insulating pads NP, the second insulating layer 110, the mold structure MS, the lower semiconductor layer 105, the lower sacrificial layer 103, and one of the lower insulating patterns 101. The second contact hole CTH2 may be formed to penetrate one of the insulating pads NP, the second insulating layer 110, and one of the lower insulating patterns 101. Each of the first and second contact holes CTH1 and CTH2 may be formed to penetrate at least a portion of the first insulating layer 30 and to expose a corresponding one of the peripheral circuit interconnection lines 33 of the peripheral circuit structure PS.

The vertical channel holes CH may be formed on the second region R2 and around the first contact holes CTH1 to define spaces, in which the second vertical channel structures VS2 will be formed. Each of the vertical channel holes CH on the second region R2 may penetrate one of the insulating pads NP, the second insulating layer 110, the mold structure MS, the lower semiconductor layer 105, and the lower sacrificial layer 103 and may expose the second substrate 100.

The first and second vertical channel structures VS1 and VS2 may be formed in the vertical channel holes CH, and the first and second contact plugs CP1 and CP2 may be formed in the first and second contact holes CTH1 and CTH2. The formation of the first contact plugs CP1 may include recessing the sacrificial layers SL, which are exposed by the first contact holes CTH1, to form empty spaces, filling the empty spaces and the first contact holes CTH1 with an insulating material, removing the insulating material from the first contact holes CTH1, and filling the first contact holes CTH1 with a conductive material. The insulating material, which is left in the empty spaces formed by recessing the sacrificial layers SL, may be referred to as the insulating separation pattern IP. An end portion of the sacrificial layer SL may have a thickness larger than other portion of the sacrificial layer SL, it may be less recessed, and thus, the insulating separation pattern IP may not be left in the end portion of the sacrificial layer SL. The lower sacrificial layer 103 and the lower semiconductor layer 105 may also be recessed during the recessing of the sacrificial layers SL, and the insulating material, which is left in empty spaces formed by the recessing of the lower sacrificial layer 103 and the lower semiconductor layer 105, may also be referred to as the insulating separation pattern IP.

The first trenches TR1 may be formed to cross the mold structure MS in the first direction D1 and to expose the sacrificial layers SL and the lower sacrificial layer 103. The sacrificial layers SL and the lower sacrificial layer 103 exposed through the first trenches TR1 may be selectively removed.

The selective removal of the sacrificial layers SL and the lower sacrificial layer 103 may be achieved by, e.g., a wet etching process using an etching solution. The selective removal of the sacrificial layers SL and the lower sacrificial layer 103 may be performed to help prevent or suppress the interlayer insulating layers ILD from being removed.

A first gap region, which is an empty space formed by removing the lower sacrificial layer 103, and second gap regions, which are empty spaces formed by removing the sacrificial layers SL, may be formed by the wet etching process. Side surfaces of the first and second vertical channel structures VS1 and VS2 may be partially exposed through the first and second gap regions. In an implementation, the side surface of the vertical semiconductor pattern VSP of each of the first and second vertical channel structures VS1 and VS2 may be partially exposed through the first gap region.

The first source conductive pattern SCP1 may be formed to fill the first gap region. The lower semiconductor layer 105 on the first source conductive pattern SCP1 may be referred to as the second source conductive pattern SCP2. The first and second source conductive patterns SCP1 and SCP2 may constitute the source structure SC.

The gate electrodes EL may be formed to ill the second gap regions. The gate electrodes EL and the interlayer insulating layers ILD therebetween may constitute the stack ST. Thereafter, the first separation structures SS1 may be formed to fill the first trenches TR1, respectively.

The bit line contact plugs BP may be formed on the first region R1 to penetrate the fourth insulating layer 150 and to be connected to the conductive pads PAD of the first vertical channel structures VS1, respectively. The bit lines BL may be formed on the fourth insulating layer 150 and may be electrically connected to the first vertical channel structures VS1 through the bit line contact plugs BP.

On the second region R2, the first and second conductive lines CL1 and CL2 may be formed on the fourth insulating layer 150 and may be connected to one of the gate electrodes EL or one of the peripheral circuit transistors PTR through the first and second contact plugs CP1 and CP2.

Figure 11:
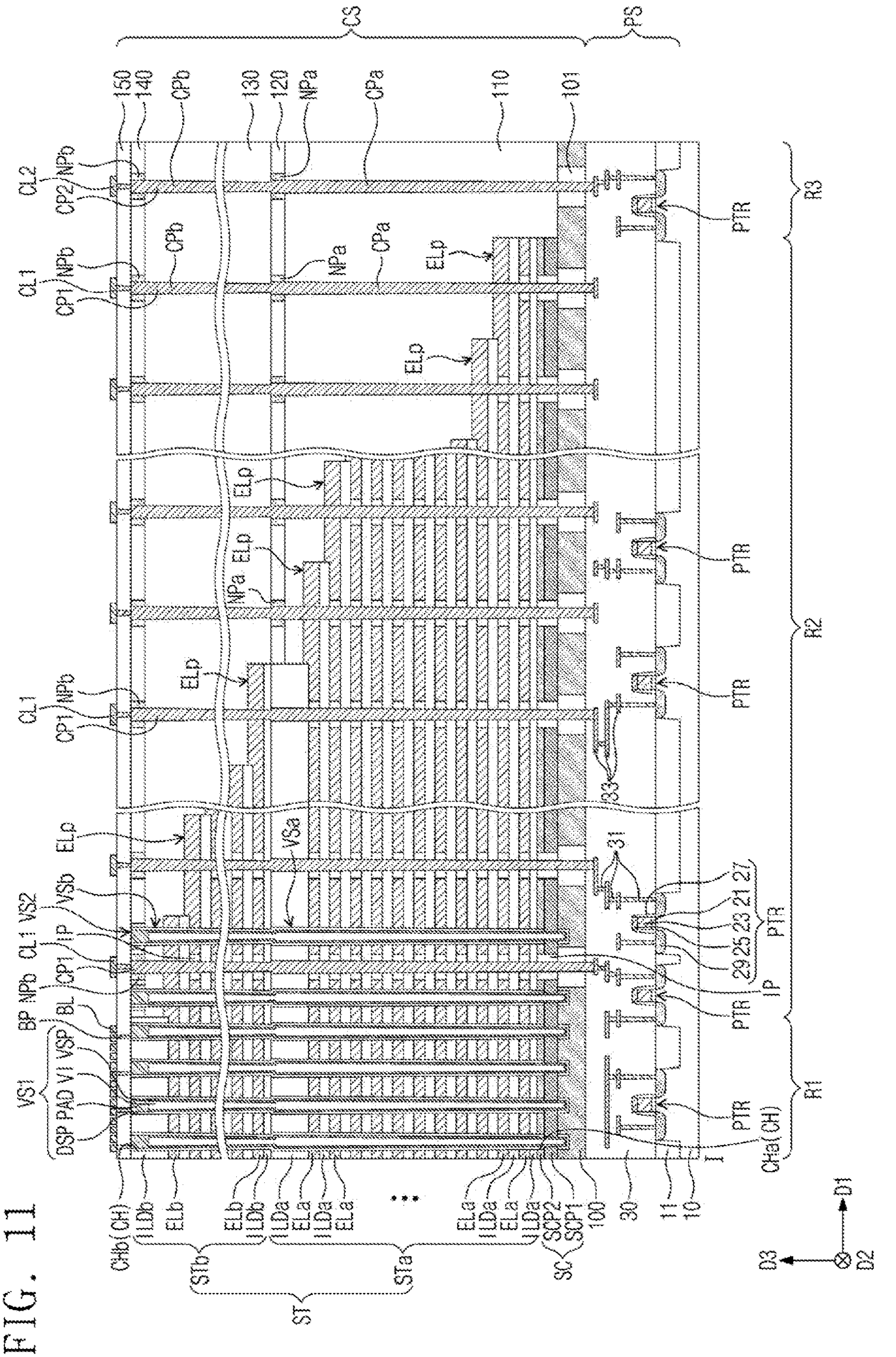
FIGS. 11 and 12 are sectional views of a three-dimensional semiconductor memory device according to an embodiment.

FIG. 11 is a sectional view of a three-dimensional semiconductor memory device according to an embodiment. In the following description, an element previously described with reference to FIGS. 5A and 5B may be identified by the same reference number without repeating an overlapping description thereof, for concise description.

Referring to FIG. 11, the stack ST may include interlayer insulating layers ILDa and ILDb and gate electrodes ELa and ELb, which are alternately and repeatedly stacked. In an implementation, the stack ST may include a lower stack STa on the second substrate 100 and an upper stack STb on the lower stack STa. The lower stack Sta may include first interlayer insulating layers ILDa and first gate electrodes ELa, which are alternately and repeatedly stacked, and the upper stack STb may include second interlayer insulating layers ILDb and second gate electrodes ELb, which are alternately and repeatedly stacked.

As a distance from the second substrate 100 (e.g., in the third direction D3) increases, a length of each of the first and second gate electrodes ELa and ELb in the first direction D1 may decrease. In an implementation, the length of each of the first and second gate electrodes ELa and ELb in the first direction D1 may be larger than a length of another electrode thereon in the first direction D1. The first and second gate electrodes ELa and ELb may have the pad portions ELp on the second region R2. The pad portions ELp of the first and second gate electrodes ELa and ELb may be at positions that are different from each other in horizontal and vertical directions. The pad portions ELp may form the staircase structure in the first direction D1.

The lowermost one of the second interlayer insulating layers ILDb may be in contact with the uppermost one of the first interlayer insulating layers ILDa. In an implementation, the lowermost one of the first interlayer insulating layers ILDa may have a thickness that is smaller than those of the remaining ones of the interlayer insulating layers ILDa and ILDb. In an implementation, the uppermost one of the first interlayer insulating layers ILDa and the uppermost one of the second interlayer insulating layers ILDb may have a thickness that is larger than those of the others of the interlayer insulating layers ILDa and ILDb. In an implementation, the thicknesses of the first and second interlayer insulating layers ILDa and ILDb may be variously changed, depending on technical properties for each semiconductor device.

The second insulating layer 110 may be on the second region R2 and may cover the staircase structure of the lower stack STa. The third insulating layer 120 may be on the second insulating layer 110. The top surface of the third insulating layer 120 may be substantially coplanar with the topmost surface of the lower stack STa (e.g., the top surface of the uppermost one of the first interlayer insulating layers ILDa). The fourth insulating layer 150 may be on the upper stack STb. A fifth insulating layer 130 may be between the third insulating layer 120 and the fourth insulating layer 150 and may cover the staircase structure of the upper stack STb and the third insulating layer 120. A sixth insulating layer 140 may be on the fifth insulating layer 130. The sixth insulating layer 140 may be between the fifth insulating layer 130 and the fourth insulating layer 150. A top surface of the sixth insulating layer 140 may be substantially coplanar with the topmost surface of the upper stack STb (e.g., the top surface of the uppermost one of the second interlayer insulating layers ILDb). Each of the second to sixth insulating layers 110, 120, 130, 140, and 150 may be formed of or include, e.g., silicon oxide, silicon nitride, or silicon oxynitride. In an implementation, the third insulating layer 120 and the sixth insulating layer 140 may be formed of or include doped silicon oxide.

Each of the first and second vertical channel structures VS1 and VS2 may include a lower vertical channel structure VSa, which is in each of lower vertical channel holes CHa penetrating the lower stack Sta, and an upper vertical channel structure VSb, which is in each of upper vertical channel holes CHb penetrating the upper stack STb. The lower vertical channel structure VSa may be connected to the upper vertical channel structure VSb in the third direction D3.

As a height in the third direction D3 increases, a width of each of the upper and lower vertical channel structures VSa and VSb may increase. In an implementation, the uppermost width of the lower vertical channel structure VSa may be larger than the lowermost width of the upper vertical channel structure VSb. In an implementation, a side surface of each of the first and second vertical channel structures VS1 and VS2 may have a stepwise shape near an interface between the lower and upper vertical channel structures VSa and VSb. In an implementation, the side surface of each of the first and second vertical channel structures VS1 and VS2 may have three or more stepwise portions at different levels or may have a flat shape without a stepwise portion.

Each of the first and second contact plugs CP1 and CP2 may include a lower contact plug CPa, which penetrates the lower stack STa or the second and third insulating layers 110 and 120, and an upper contact plug CPb, which penetrates the upper stack STb or the fifth and sixth insulating layers 130 and 140. The lower contact plug CPa may be connected to the upper contact plug CPb in the third direction D3.

As a height in the third direction D3 increases, a width of each of the upper and lower contact plugs CPa and CPb may increase. In an implementation, the uppermost width of the lower contact plug CPa may be larger than the lowermost width of the upper contact plug CPb. In an implementation, a side surface of each of the first and second contact plugs CP1 and CP2 may have a stepwise shape near an interface between the lower and upper contact plugs CPa and CPb. In an implementation, the side surface of each of the first and second contact plugs CP1 and CP2 may have three or more stepwise portions located at different levels or may be a flat shape without a stepwise portion.

Lower insulating pads NPa may be in the third insulating layer 120 and may enclose an upper portion of the lower vertical channel structure VSa of each of the second vertical channel structures VS2 and an upper portion of the lower contact plug CPa of each of the first and second contact plugs CP1 and CP2. When viewed in a plan view, each of the lower insulating pads NPa may be enclosed by the third insulating layer 120. The lower insulating pad NPa may not be near an upper portion of the lower vertical channel structure VSa and an upper portion of the lower contact plug CPa penetrating the uppermost one of the first interlayer insulating layers ILDa.

Upper insulating pads NPb may be in the sixth insulating layer 140 and may enclose an upper portion of the upper vertical channel structure VSb of each of the second vertical channel structures VS2 and an upper portion of the upper contact plug CPb of each of the first and second contact plugs CP1 and CP2. When viewed in a plan view, each of the upper insulating pads NPb may be enclosed by the sixth insulating layer 140.

The lower and upper insulating pads NPa and NPb may be formed of or include an insulating material different from the second to sixth insulating layers 110, 120, 130, 140, and 150. In an implementation, the second to sixth insulating layers 110, 120, 130, 140, and 150 may be formed of or include silicon oxide, and the lower and upper insulating pads NPa and NPb may be formed of or include silicon nitride.

Figure 12:
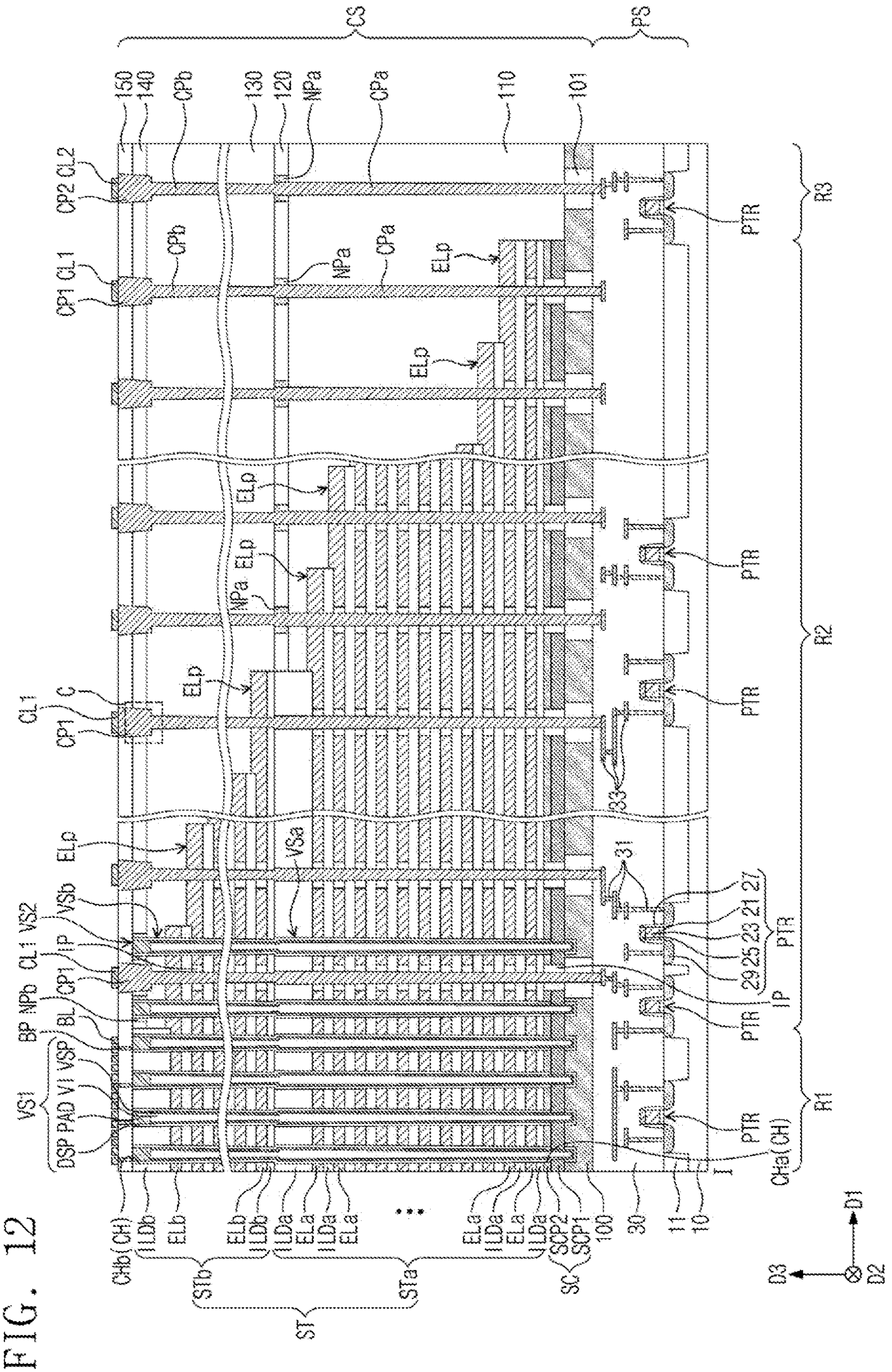
Figure 13A:
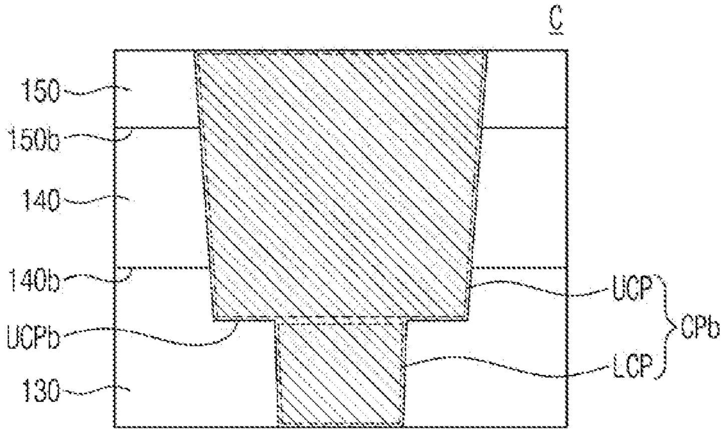
FIGS. 13A, 13B, and 13C are enlarged sectional views, of a portion (e.g., 'C' of FIG. 12) of a three-dimensional semiconductor memory device according to an embodiment.
Figure 13B:
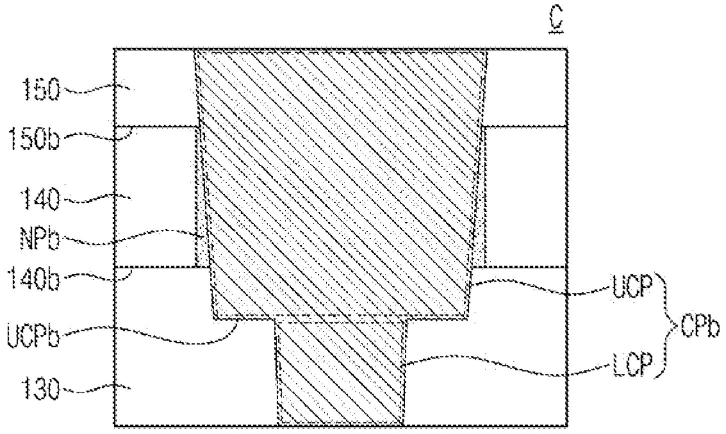
Figure 13C:
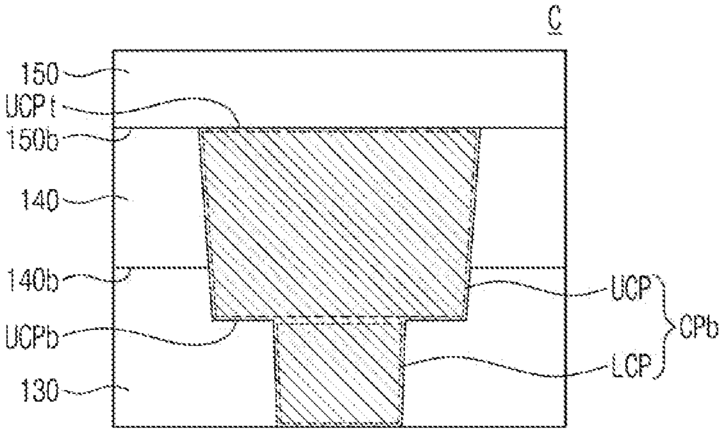

FIG. 12 is a sectional view of a three-dimensional semiconductor memory device according to an embodiment. FIGS. 13A, 13B, and 13C are enlarged sectional views, of a portion (e.g., 'C' of FIG. 12) of a three-dimensional semiconductor memory device according to an embodiment. In the following description, an element previously described with reference to FIGS. 5A, 5B, and 11 may be identified by the same reference number without repeating an overlapping description thereof, for concise description.

Referring to FIGS. 12 and 13A, the upper contact plug CPb of each of the first and second contact plugs CP1 and CP2 may include a lower portion LCP and an upper portion UCP. The upper portion UCP may be on the lower portion LCP. When measured in a horizontal direction (e.g., the first direction D1), a width of the upper portion UCP may be larger than a width of the lower portion LCP. The lowermost width of the upper portion UCP may be larger than the uppermost width of the lower portion LCP. At least a portion of a bottom surface UCPb of the upper portion UCP may be in contact with the fifth insulating layer 130 and may not be in contact with the lower portion LCP. In an implementation, the upper contact plug CPb of each of the first and second contact plugs CP1 and CP2 may have a stepwise shape near an interface between the lower portion LCP and the upper portion UCP.

In an implementation, the bottom surface UCPb of the upper portion UCP may be at a level lower than a bottom surface 140*b* of the sixth insulating layer 140. In an implementation, the bottom surface UCPb of the upper portion UCP may be at a level that is substantially equal to or higher than the bottom surface 140*b* of the sixth insulating layer 140. In an implementation, the bottom surface UCPb of the upper portion UCP may be at a level that is lower than a bottom surface 150*b* of the fourth insulating layer 150.

Referring to FIGS. 12 and 13B, the upper insulating pad NPb may be between the bottom surface 140*b* of the sixth insulating layer 140 and the bottom surface 150*b* of the fourth insulating layer 150 to cover a side surface of the upper portion UCPb. In an implementation, the upper insulating pad NPb may be a remaining portion which is not removed during a process of forming the upper portion UCP of the upper contact plug CPb. The upper insulating pad NPb may be in the sixth insulating layer 140.

Referring to FIGS. 12 and 13C, the upper portion UCP of the upper contact plug CPb may have a top surface UCPt that is substantially coplanar with the bottom surface 150*b* of the fourth insulating layer 150.

Figure 14:
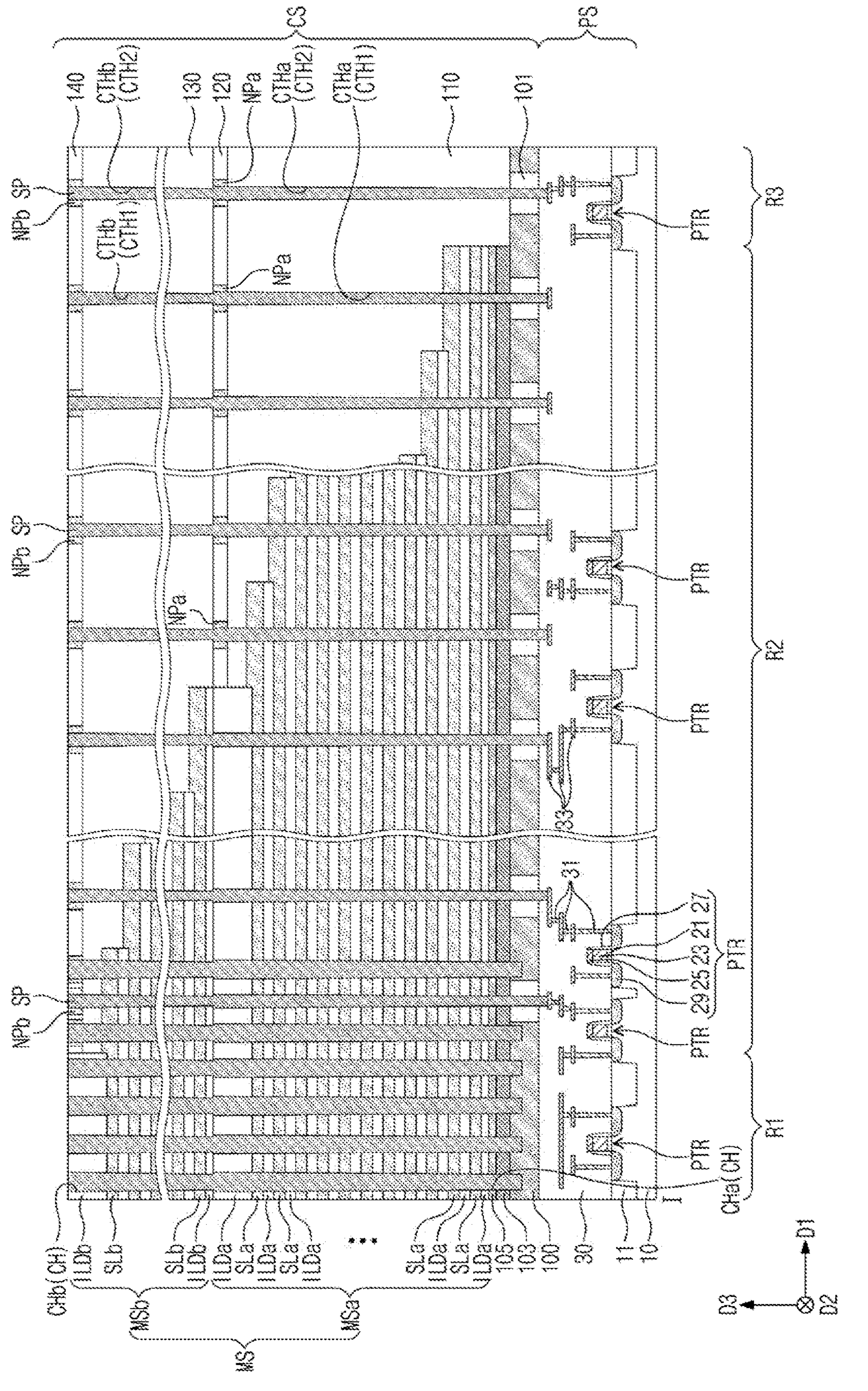
FIGS. 14 and 15 are sectional views of stages in a method of fabricating a three-dimensional semiconductor memory device according to an embodiment.
Figure 15:
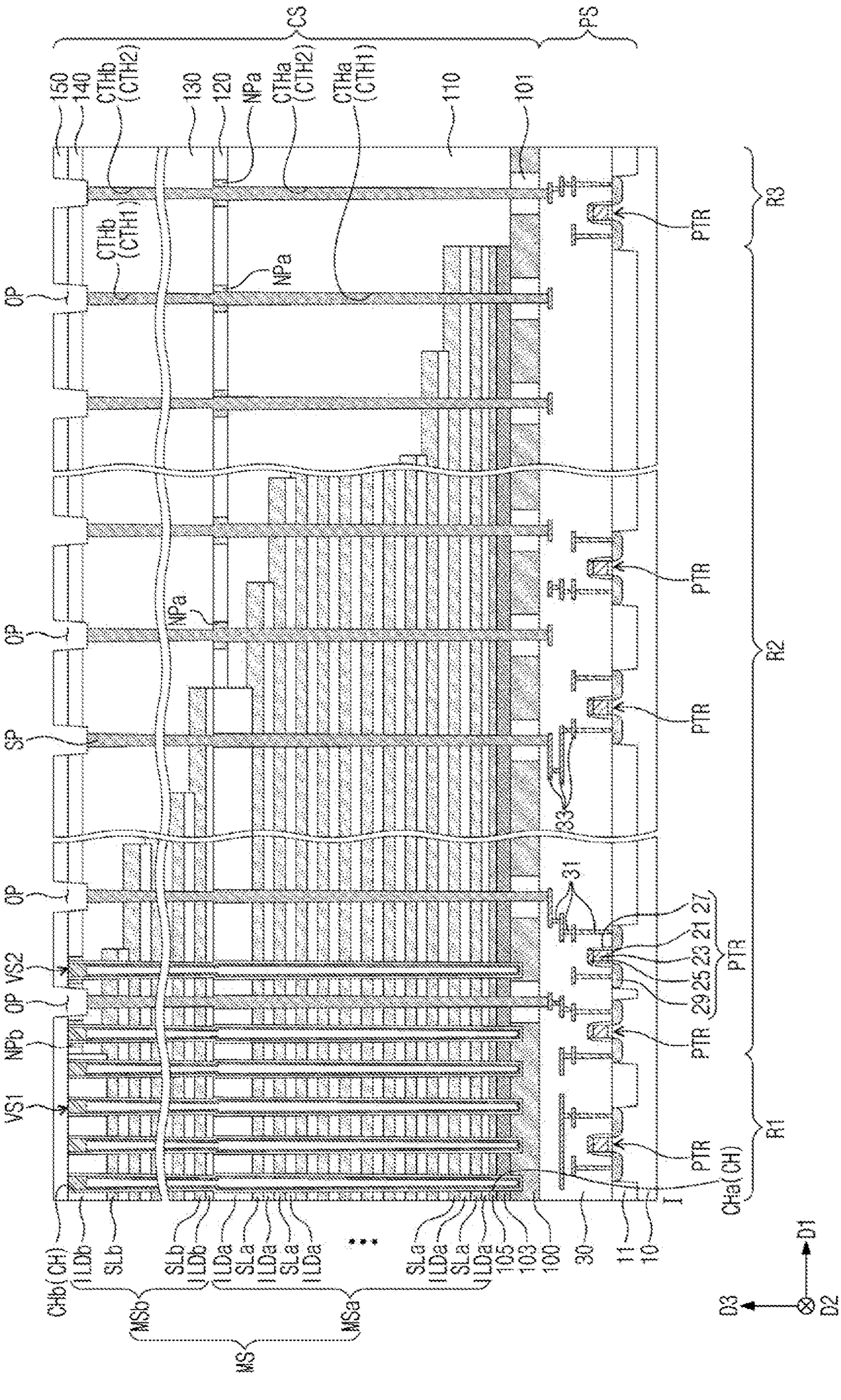

FIGS. 14 and 15 are sectional views of stages in a method of fabricating a three-dimensional semiconductor memory device according to an embodiment. Hereinafter, a method of fabricating the three-dimensional semiconductor memory device of FIG. 12 will be described in more detail with reference to FIGS. 14 and 15.

Referring to FIG. 14, the peripheral circuit structure PS, the second substrate 100, the lower insulating patterns 101, a lower mold structure MSa, the second and third insulating layers 110 and 120 covering them, and the lower insulating pads NPa in the third insulating layer 120 may be formed by substantially the same method as described with reference to FIGS. 8 to 10.

Thereafter, the lower vertical channel holes CHa may be formed to penetrate the lower mold structure MSa, and lower contact holes CTHa may be formed to penetrate the lower mold structure MSa or the second and third insulating layers 110 and 120. In an implementation, the lower vertical channel holes CHa and the lower contact holes CTHa may be filled with polysilicon.

In an implementation, an upper mold structure MSb on the lower mold structure MSa and the third insulating layer 120, the fifth and sixth insulating layers 130 and 140, and the upper insulating pads NPb in the sixth insulating layer 140 may be formed by substantially the same method as described with reference to FIGS. 8 to 10.

Thereafter, the upper vertical channel holes CHb may be formed to penetrate the upper mold structure MSb, and upper contact holes CTHb may be formed to penetrate the upper mold structure MSb or fifth and sixth insulating layers 130 and 140. Each of the upper vertical channel holes CHb may be connected to a corresponding one of the lower vertical channel holes CHa in the third direction D3, and each of the upper contact holes CTHb may be connected to a corresponding one of the lower contact holes CTHa in the third direction D3. In an implementation, the upper vertical channel holes CHb and the upper contact holes CTHb may be filled with polysilicon. As a result, sacrificial pillars SP filling the upper and lower vertical channel holes CHa and CHb and the upper and lower contact holes CTHa and CTHb may be formed.

Referring to FIG. 15, the sacrificial pillars SP filling the upper and lower vertical channel holes CHa and CHb may be removed, and then, the first and second vertical channel structures VS1 and VS2 may be formed to fill empty spaces which are formed by removing the sacrificial pillars SP.

The fourth insulating layer 150 may be formed on the upper mold structure MSb and the sixth insulating layer 140. A plurality of openings OP may be formed by patterning the fourth insulating layer 150 and the sixth insulating layer 140. A portion of the fifth insulating layer 130 and a portion of each of the sacrificial pillars SP may be removed during the process of forming the openings OP.

The sacrificial pillars SP in the upper contact holes CTHb may be partially exposed through the openings OP. In other words, the openings OP may be formed at positions corresponding to the upper contact holes CTHb.

In an implementation, before the formation of the fourth insulating layer 150, the openings OP may be formed by patterning the sixth insulating layer 140. In this case, the upper contact plug CPb may be formed to have the structure of FIG. 13C.

In an implementation, after the formation of the fourth insulating layer 150, the sacrificial pillars SP filling the upper and lower vertical channel holes CHa and CHb and the upper and lower contact holes CTHa and CTHb may be removed at a time.

Referring to FIGS. 12 and 15, the sacrificial pillars SP, which are exposed through the openings OP, may be removed, and then, the first and second contact plugs CP1 and CP2 may be formed to fill empty spaces, which are formed by removing the sacrificial pillars SP, and the openings OP. Thereafter, the stack ST including the upper and lower stacks STa and STb may be formed by replacing first and second sacrificial layers SLa and SLb with the first and second gate electrodes ELa and ELb. As a result, a three-dimensional semiconductor memory device having the cell array structure CS of FIG. 12 may be formed by substantially the same method as described with reference to FIGS. 5A and 5B, along with FIG. 10.

Figure 16:
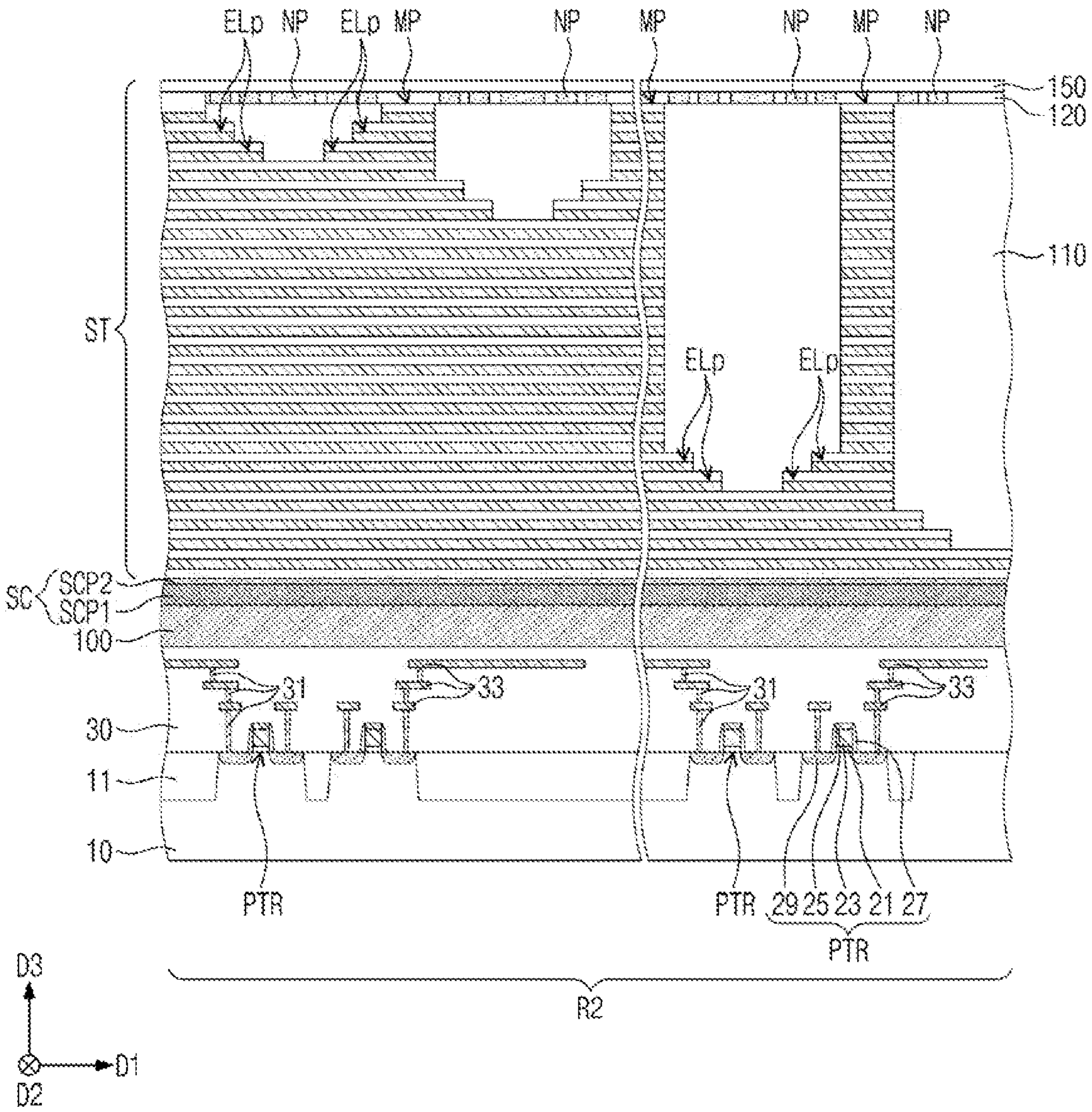
FIG. 16 is a sectional view of a three-dimensional semiconductor memory device according to an embodiment.

FIG. 16 is a sectional view of a three-dimensional semiconductor memory device according to an embodiment. In the following description, an element previously described with reference to FIGS. 5A, 5B, 11, and 12 may be identified by the same reference number without repeating an overlapping description thereof, for concise description.

Referring to FIG. 16, the stack ST may include mold pillars MP, which are on the second region R2, extend in the third direction D3, and are in contact with the bottom surface of the third insulating layer 120. As a distance from the first region R1 increases, heights of the mold pillars MP in the third direction D3 may increase. The second insulating layer 110 may fill a space between the mold pillars MP. The mold pillars MP may be horizontally spaced apart from each other with a portion of the second insulating layer 110 interposed therebetween.

The gate electrodes EL of the stack ST may form staircase structures, which extend to face each other between the mold pillars MP. In an implementation, as a distance from each mold pillar MP increases, the pad portion ELp of the gate electrode EL may be at a lowered level. The pad portions ELp of the gate electrodes EL, which face each other with the portion of the second insulating layer 110 therebetween, may be at the same level.

Contact plugs may penetrate the pad portions ELp of the gate electrodes EL, and the insulating pads NP may be in portions of the third insulating layer 120 corresponding to the contact plugs. In an implementation, the insulating pads NP may be in portions of the third insulating layer 120 corresponding to the mold pillars MP.

By way of summation and review, three-dimensional semiconductor memory devices including three-dimensionally arranged memory cells have been considered.

In a three-dimensional semiconductor memory device according to an embodiment, an insulating pad may enclose an upper portion of a contact plug, and this may make it possible to help prevent or suppress a bowing phenomenon from occurring in the contact plug, to help prevent or suppress a side surface of the contact plug from being inclined to a vertical direction, and to help reduce a variation in the uppermost widths of the contact plugs.

Accordingly, it may be possible to help prevent or suppress a bridge pattern from being from between adjacent ones of the contact plugs and to easily control a height, in the vertical direction, of each of the contact plugs. As a result, electric and reliability characteristics of the three-dimensional semiconductor memory device may be improved.

One or more embodiments may provide a nonvolatile three-dimensional semiconductor memory device including a vertical channel structure.

One or more embodiments may provide a three-dimensional semiconductor memory device with improve electrical and reliability characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:

a substrate including a first region and a second region, the second region extending from the first region;

a stack including interlayer insulating layers and gate electrodes, which are alternately and repeatedly stacked on the substrate, the stack having a staircase structure on the second region;

an insulating layer covering the staircase structure of the stack;

first vertical channel structures on the first region, penetrating the stack, and in contact with the substrate;

first contact plugs on the second region and penetrating the insulating layer and the stack; and first insulating pads in the insulating layer and enclosing upper portions of the first contact plugs, respectively, wherein the first insulating pads are formed of an insulating material that is different from an insulating material of the insulating layer, and outer surfaces of the first insulating pads are in contact with respective inner surfaces of the insulating layer, wherein the first insulating pads overlap with the first vertical channel structures in a horizontal direction.

2. The semiconductor memory device as claimed in claim 1, further comprising:

second vertical channel structures on the second region, penetrating the insulating layer and the stack, and being adjacent to each of the first contact plugs; and second insulating pads in the insulating layer and enclosing upper portions of the second vertical channel structures, respectively, wherein the second insulating pads overlap with the first insulating pads in the horizontal direction.

3. The semiconductor memory device as claimed in claim 2, wherein:

the insulating layer includes silicon oxide, and the first insulating pads and the second insulating pads each include silicon nitride.

4. The semiconductor memory device as claimed in claim 1, wherein:

each of the first contact plugs includes a first portion enclosed by the insulating layer, and a second portion on the first portion and enclosed by each of the first insulating pads, a side surface of the first portion has a convexly curved profile, and a level at which a first width defined as a width of the first portion in the horizontal direction is a maximum is lower than a level of a bottom surface of each of the first insulating pads.

5. The semiconductor memory device as claimed in claim 4, wherein a side surface of the second portion has a linear profile.

6. The semiconductor memory device as claimed in claim 4, wherein a ratio of the first width to a width of an uppermost part of the second portion ranges from 100% to 110%.

7. The semiconductor memory device as claimed in claim 6, wherein the width of the uppermost part of the second portion ranges from 90 nm to 120 nm.

8. The semiconductor memory device as claimed in claim 4, wherein:

the side surface of the first portion includes a first side surface connected to a side surface of the second portion without any stepwise portion, and a second side surface extending from the first side surface in a downward direction, the first side surface has a linear profile, and the second side surface has a convexly curved profile.

9. The semiconductor memory device as claimed in claim 1, wherein:

the stack includes a lower stack on the substrate and an upper stack on the lower stack, the insulating layer includes a lower insulating layer covering the lower stack and an upper insulating layer covering the upper stack, each of the first contact plugs includes a lower contact plug penetrating the lower stack and the lower insulating layer and an upper contact plug penetrating the upper stack and the upper insulating layer, and the first insulating pads include lower insulating pads in the lower insulating layer and enclosing upper portions of the lower contact plugs, and upper insulating pads in the upper insulating layer and enclosing upper portions of the upper contact plugs.

10. The semiconductor memory device as claimed in claim 9, wherein each of the first contact plugs has a stepwise shape at an interface between the lower contact plug and the upper contact plug.

11. The semiconductor memory device as claimed in claim 9, wherein:

the upper contact plug includes a lower portion and an upper portion, and a lowermost width of the upper portion is larger than an uppermost width of the lower portion.

12. The semiconductor memory device as claimed in claim 11, wherein a side surface of the upper portion of the upper contact plug is in contact with one upper insulating pad of the upper insulating pads.

13. The semiconductor memory device as claimed in claim 11, wherein a top surface of the upper portion of the upper contact plug is at the same level as a topmost surface of the upper stack and a top surface of the upper insulating layer.

14. The semiconductor memory device as claimed in claim 1, wherein the stack includes mold pillars on the second region and extending in a vertical direction.

15. A three-dimensional semiconductor memory device, comprising:

a first substrate including a first region, a second region extending from the first region, and a third region extending from the second region;

a peripheral circuit structure including peripheral circuit transistors on the first substrate;

a first insulating layer covering the peripheral circuit transistors;

a second substrate on the peripheral circuit structure;

lower insulating patterns in the second substrate;

a stack including interlayer insulating layers and gate electrodes, which are alternately and repeatedly stacked on the second substrate and the lower insulating patterns, and having a staircase structure on the second region;

a second insulating layer covering the staircase structure of the stack;

a third insulating layer on the second insulating layer and coplanar with a topmost surface of the stack;

vertical channel structures on the first region, penetrating the stack, and in contact with the second substrate;

first contact plugs on the second region, the first contact plugs each penetrating the second and third insulating layers, the stack, and one of the lower insulating patterns, and being electrically connected to the peripheral circuit structure;

a second contact plug on the third region, penetrating the second insulating layer and the third insulating layer and another of the lower insulating patterns, and being electrically connected to the peripheral circuit structure;

insulating pads in the third insulating layer and enclosing upper portions of the first contact plugs and the second contact plug, respectively;

bit lines on the third insulating layer and electrically connected to the vertical channel structures, respectively; and conductive lines on the third insulating layer and electrically connected to the first contact plugs and the second contact plug, respectively.

16. The semiconductor memory device as claimed in claim 15, further comprising a source structure between the second substrate and the stack, wherein:

each of the vertical channel structures includes a data storage pattern adjacent to the stack, a vertical semiconductor pattern conformally covering an inner side surface of the data storage pattern, and a conductive pad on the vertical semiconductor pattern, and the source structure is in contact with the vertical semiconductor pattern of each of the vertical channel structures.

17. The semiconductor memory device as claimed in claim 16, further comprising insulating separation patterns respectively between each of the first contact plugs and the gate electrodes and between each of the first contact plugs and the source structure.

18. The semiconductor memory device as claimed in claim 15, wherein:

each of the gate electrodes has a pad portion on the second region, a thickness of the pad portion of each of the gate electrodes is larger than a thickness of other portion of each of the gate electrodes, and each of the first contact plugs penetrates the pad portion and is in contact with the pad portion.

19. An electronic system, comprising:

a three-dimensional semiconductor memory device; and a controller electrically connected to the three-dimensional semiconductor memory device and configured to control the three-dimensional semiconductor memory device, wherein:

the three-dimensional semiconductor memory device includes:

a substrate including a first region, a second region extending from the first region, and a third region extending from the second region;

a stack including interlayer insulating layers and gate electrodes, which are alternately and repeatedly stacked on the substrate, and having a staircase structure on the second region;

an insulating layer covering the staircase structure of the stack;

vertical channel structures on the first region, penetrating the stack, and in contact with the substrate;

first contact plugs on the second region and penetrating the insulating layer and the stack;

a second contact plug on the third region and penetrating the insulating layer and the substrate;

insulating pads in the insulating layer and enclosing upper portions of each of the first and second contact plugs, wherein outer surfaces of the insulating pads are in contact with respective inner surfaces of the insulating layer; and an input/output pad connected to the second contact plug, the controller is electrically connected to the three-dimensional semiconductor memory device through the input/output pad, and a height of each of the first contact plugs and the second contact plug in a vertical direction is larger than a height of each of the vertical channel structures in the vertical direction.

20. The electronic system as claimed in claim 19, wherein:

the three-dimensional semiconductor memory device further includes a peripheral circuit structure below the substrate, each of the first contact plugs and the second contact plug is in contact with a corresponding one of peripheral circuit interconnection lines of the peripheral circuit structure, and the input/output pad is electrically connected to the peripheral circuit structure through the second contact plug.

* * * * *